(12) United States Patent
Fujikawa et al.

(10) Patent No.: US 6,898,230 B2
(45) Date of Patent: May 24, 2005

(54) SOLID STATE LASER DEVICE AND SOLID STATE LASER DEVICE SYSTEM

(75) Inventors: Shuichi Fujikawa, Tokyo (JP); Koji Yasui, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/985,471

(22) Filed: Nov. 2, 2001

(65) Prior Publication Data

US 2002/0051479 A1 May 2, 2002

(30) Foreign Application Priority Data

Nov. 2, 2000 (JP) .................................... 2000-335747

(51) Int. Cl.$^7$ .............................................. H01S 3/091
(52) U.S. Cl. ............................................ 372/70; 372/9
(58) Field of Search ............................ 372/10, 71, 72, 372/73, 74, 75, 101, 22, 36, 9, 7, 70

(56) References Cited

U.S. PATENT DOCUMENTS

| | | | | |
|---|---|---|---|---|
| 4,884,277 A | * | 11/1989 | Anthon et al. ................. 372/22 |
| 4,935,931 A | | 6/1990 | McGraw | |
| 5,022,034 A | * | 6/1991 | May et al. ..................... 372/26 |
| 5,091,915 A | * | 2/1992 | Tatsumi et al. ................ 372/75 |
| 5,132,977 A | * | 7/1992 | Zayhowski et al. ........... 372/10 |
| 5,256,164 A | * | 10/1993 | Mooradian ..................... 438/27 |
| 5,265,115 A | * | 11/1993 | Amano ........................... 372/75 |
| 5,265,116 A | * | 11/1993 | Mooradian ..................... 372/75 |
| 5,268,978 A | * | 12/1993 | Po et al. ......................... 385/33 |
| 5,289,482 A | | 2/1994 | Esterowitz et al. | |
| 5,408,480 A | * | 4/1995 | Hemmati ....................... 372/10 |
| 5,408,481 A | * | 4/1995 | Scheps ........................... 372/22 |
| 5,418,880 A | * | 5/1995 | Lewis et al. ................... 385/123 |
| 5,485,482 A | | 1/1996 | Selker et al. | |
| 5,488,619 A | | 1/1996 | Injeyan et al. | |
| 5,513,201 A | * | 4/1996 | Yamaguchi et al. ........... 372/75 |
| 5,592,333 A | * | 1/1997 | Lewis ............................ 359/628 |
| 5,600,666 A | * | 2/1997 | Hiiro ............................. 372/24 |
| 5,612,969 A | * | 3/1997 | Dombi ........................... 372/75 |
| 5,675,596 A | * | 10/1997 | Kong et al. .................... 372/25 |
| 5,708,672 A | * | 1/1998 | Pessot et al. ................... 372/23 |
| 5,761,227 A | * | 6/1998 | Hargis et al. .................. 372/22 |
| 5,854,802 A | * | 12/1998 | Jin et al. ........................ 372/22 |
| 5,995,522 A | * | 11/1999 | Scherrer et al. ............... 372/21 |
| 6,016,214 A | * | 1/2000 | Meyer et al. .................. 359/237 |
| 6,026,101 A | * | 2/2000 | Suzudo et al. ................. 372/22 |
| 6,044,096 A | * | 3/2000 | Wolak et al. .................. 372/36 |
| 6,169,565 B1 | * | 1/2001 | Ramanujan et al. .......... 347/238 |
| 6,239,901 B1 | | 5/2001 | Kaneko | |
| 6,269,108 B1 | * | 7/2001 | Tabirian et al. ............... 372/39 |
| 6,304,585 B1 | * | 10/2001 | Sanders et al. ................ 372/22 |
| 6,330,262 B1 | * | 12/2001 | Burrows et al. .............. 372/39 |
| 6,344,920 B1 | * | 2/2002 | Fukumoto ..................... 359/330 |
| 6,400,495 B1 | * | 6/2002 | Zayhowski .................. 359/333 |

FOREIGN PATENT DOCUMENTS

| | | | | |
|---|---|---|---|---|
| EP | 0272912 | * | 6/1988 | ............. H01S/3/11 |
| WO | WO 91/06994 | | 5/1991 | |

OTHER PUBLICATIONS

Taira et al., "Modeling Of End–Pumped Quasi–Three–Level Lasers By Using a $M^2$ Factor And CW Operation Of Tunable Yb:YAG Miniature Lasers", OSA TOPS, Vol. 10, Advanced Solid State Lasers, 1997, pp. 189–191.

* cited by examiner

*Primary Examiner*—Minsun Oh Harvey
*Assistant Examiner*—Tuan N. Nguyen
(74) *Attorney, Agent, or Firm*—Leydig, Voit & Mayer, Ltd.

(57) ABSTRACT

A semiconductor laser array is located beside a solid state laser element, and an optical resonator for excitation light includes a coating highly reflective to an oscillation wavelength of the semiconductor laser array on an end face of the semiconductor laser array, opposite from the solid state laser element and a side of the solid state laser element. The solid state laser element is located inside of the optical resonator, and the solid state laser element is excited optically by the excitation light.

18 Claims, 26 Drawing Sheets

SOLID STATE LASER DEVICE AND SOLID STATE LASER DEVICE SYSTEM

BACKGROUND OF THE INVENTION

1. Technical Field

The present invention relates to a solid state laser device generating laser light stably and effectively with a simple and inexpensive structure.

2. Related Art

FIG. 26 is a schematic view showing a structure of the solid state laser device disclosed in Koechner, "Solid-state Laser Engineering", pp. 342 to 347 (published by Springer Verlag), for example, in the prior art. In FIG. 26, 1 is a solid state laser element containing an active medium, 2 is a semiconductor laser as an excitation light source, 3 is an excitation light emitted from the semiconductor laser array, 4 is a beam shaping optical system for converging the excitation light 3, 5 is a solid state laser light emitted from the solid state laser element 1, and 8 is a partial reflection mirror for transmitting a part of the solid state laser light.

Also, 151 is a side of the solid state laser element 1 directed to the semiconductor laser 2 side, on which a dichroic (two-wavelength) coating that exhibits a low reflectance to the semiconductor laser wavelength and also exhibits a high reflectance to the solid state laser wavelength is applied. Also, 152 is a side of the solid state laser element 1 that is on the opposite side to the semiconductor laser 2, on which the two-wavelength coating that exhibits the high reflectance to the semiconductor laser wavelength and also exhibits the low reflectance to the solid state laser wavelength is applied.

Next, an operation will be explained hereunder. The semiconductor laser 2 serving as the excitation light source generates the excitation light 3 having a wavelength that coincides with the absorption band of the solid state laser element 1. The excitation light 3 emitted from the semiconductor laser 2 is shaped into a desired beam profile by the beam shaping optical system 4, that consists of two lenses, at the side 151 of the solid state laser element 1, and then irradiates the solid state laser element 1. A part of the excitation light 3 that is incident on the solid state laser element 1 excites the active medium contained in the solid state laser element 1 to form a population inversion in the solid state laser element 1.

Also, the excitation light 3 that reaches another side 152 without the absorption in the solid state laser element 1 is reflected toward the side 151 by the dichroic coating applied to the side 152, and then contributes again to the excitation of the active medium contained in the solid state laser element 1.

The high reflection coating and the partial reflection coating that corresponds to the energy difference in the population inversion in the solid state laser element 1 are applied to the side 151 of the solid state laser element 1 and the partial reflection mirror 8, respectively. Both are part of the optical resonator.

A part of the spontaneous emission light generated in the solid state laser element 1 is confined in the optical resonator that consists of the side 151 of the solid state laser element 1 and the partial reflection mirror 8, and goes to and from the inside of the optical resonator. When the spontaneous emission light that travels reciprocally in the optical resonator passes through the population inversion region, the spontaneous emission light is subjected to the amplifying action by the stimulated emission and thus the light intensity in the optical resonator is promptly increased. The coherent solid state laser light 5 increases with an increase of the light intensity, resulting in laser oscillation. The solid state laser light 5 in the optical resonator is extracted to the outside of the optical resonator at a rate that corresponds to the transmittance of the partial reflection mirror 8.

PROBLEMS TO BE SOLVED

As described above, the solid state laser device in the prior art is constructed such that the semiconductor laser is used as the excitation light source and the laser light as the excitation light is extracted to the outside of the optical resonator to irradiate to the solid state laser element. As a result, there is such a problem that the intensity of the excitation laser light, that can be irradiated to the solid state laser element, is limited by the optical output of the excitation laser, that can be output to the outside of the optical resonator of the excitation laser. Also, there is another problem that, when the solid state laser element having a small thickness should be excited, the excitation light transmits the solid state laser element and thus it is impossible to excite effectively such solid state laser element.

The present invention has been made to overcome above-mentioned problems, and provides a solid state laser device that is capable of improving conspicuously an oscillation efficiency with a simple structure.

MEANS FOR SOLVING THE PROBLEMS

A solid state laser device according to the present invention, for exciting a solid state laser element by a laser light emitted from an excitation laser as an excitation light and then outputting a solid state laser light to an outside, wherein the solid state laser element is arranged in a first optical resonator through which the excitation light passes, and the solid state laser element is excited by the excitation light which is confined in the first optical resonator.

Also, in the solid state laser device according to the present invention, the excitation laser is formed of a semiconductor laser.

Also, in the solid state laser device according to the present invention, the first optical resonator is constructed by a mirror which consists of an end face of the semiconductor laser arranged on an opposite side to an excitation light outgoing side and has a high reflection coating to the excitation light, and a mirror which consists of a side of the solid state laser element arranged on an opposite side to the semiconductor laser and has a high reflection coating to the excitation light.

Also, in the solid state laser device according to the present invention, the first optical resonator is constructed by a mirror which consists of an end face of the semiconductor laser arranged on an opposite side to an excitation light outgoing side and has a high reflection coating to the excitation light, and a mirror which is arranged on an opposite side to said semiconductor laser across said solid state laser element on an opposite side to the semiconductor laser and has a high reflection coating to the excitation light.

Also, the solid state laser device according to the present invention further comprises a second optical resonator for extracting the solid state laser light to an outside, wherein the second optical resonator is constructed by a mirror which consists of an end face of the solid state laser element arranged on a side from which the solid state laser light is emitted and has a partial reflection coating to the solid state laser light, and a mirror which consists of another end face of the solid state laser element and has a high reflection coating to the solid state laser light.

Also, the solid state laser device according to the present invention further comprises a second optical resonator for extrcting the solid state laser light to an outside, wherein the second optical resonator is constructed by a mirror which is arranged on an opposite side across said solid state laser element in an optical direction, along which the solid state laser light is emitted, and has a partial reflection coating to the solid state laser light, and a mirror which is arranged on a side opposite to the direction in an optical direction and has a high reflection coating to the solid state laser light.

Also, in the solid state laser device according to the present invention, a low reflection coating to the excitation light is applied to the excitation light outgoing end face of the semiconductor laser.

Also, in the solid state laser device according to the present invention, a low reflection coating to the excitation light is applied to a side of the solid state laser element opposing to the semiconductor laser.

Also, in the solid state laser device according to the present invention, an optical axis of the solid state laser element has a predetermined angle to an optical axis of the excitation light that travels through the first optical resonator reciprocally.

Also, in the solid state laser device according to the present invention, an optical element for shaping a pattern of the excitation light is arranged in the first optical resonator.

Also, in the solid state laser device according to the present invention, a wavelength-converting crystal is arranged in the second optical resonator.

Also, in the solid state laser device according to the present invention, the wavelength-converting crystal is arranged on an optical axis of the solid state laser element in an outgoing direction of the solid state laser light, a coating that exhibits a high reflection to the solid state laser light and exhibits a low reflection to a second harmonic of the solid state laser light is applied to an end face of the wavelength-converting crystal on an opposite side to the solid state laser element, a coating that exhibits a low reflection to the solid state laser light and exhibits a high reflection to a second harmonic of the solid state laser light is applied to an end face of the wavelength-converting crystal opposing to the solid state laser element, a low reflection coating to the solid state laser light is applied to an end face of the solid state laser element opposing to the wavelength-converting crystal, and a high reflection coating to the solid state laser light is applied to an end face of the solid state laser element on an opposite side to the wavelength-converting crystal.

Also, in the solid state laser device according to the present invention, a passive Q switching element is arranged in the second optical resonator.

Also, in the solid state laser device according to the present invention, the passive Q switching element is arranged on an optical axis of the solid state laser element in an outgoing direction of the solid state laser light, a partial reflection coating to the solid state laser light is applied to an end face of the passive Q switching element on an opposite side to the solid state laser element, a low reflection coating to the solid state laser light is applied to an end face of the passive Q switching element opposing to the solid state laser element, a low reflection coating to the solid state laser light is applied to an end face of the solid state laser element opposing to the passive Q switching element, and a high reflection coating to the solid state laser light is applied to an end face of the solid state laser element on an opposite side to the passive Q switching element.

Also, in the solid state laser device according to the present invention, both end faces of the solid state laser element in an optical axis direction of the solid state laser light have a Brewster angle to the solid state laser light.

Also, in the solid state laser device according to the present invention, a three-level laser medium is employed as the solid state laser element.

Also, in the solid state laser device according to the present invention, the excitation laser consists of at least two lasers, and the solid state laser element is optically excited by the excitation laser in at least two directions.

Also, in the solid state laser device according to the present invention, the solid state laser element has optical paths of the solid state laser light, that are combined together via orthogonal prisms.

Also, a solid state laser device system according to the present invention, constructed by a plurality of solid state laser devices each of which is set forth in any one of claim 1 to claim 16 and which are stacked such that respective solid state laser lights are emitted in a same direction.

DETAILED DESCRIPTION OF THE PREFERRED EMBODIMENTS

Embodiments of the Invention (Embodiment 1)

Figure 1:
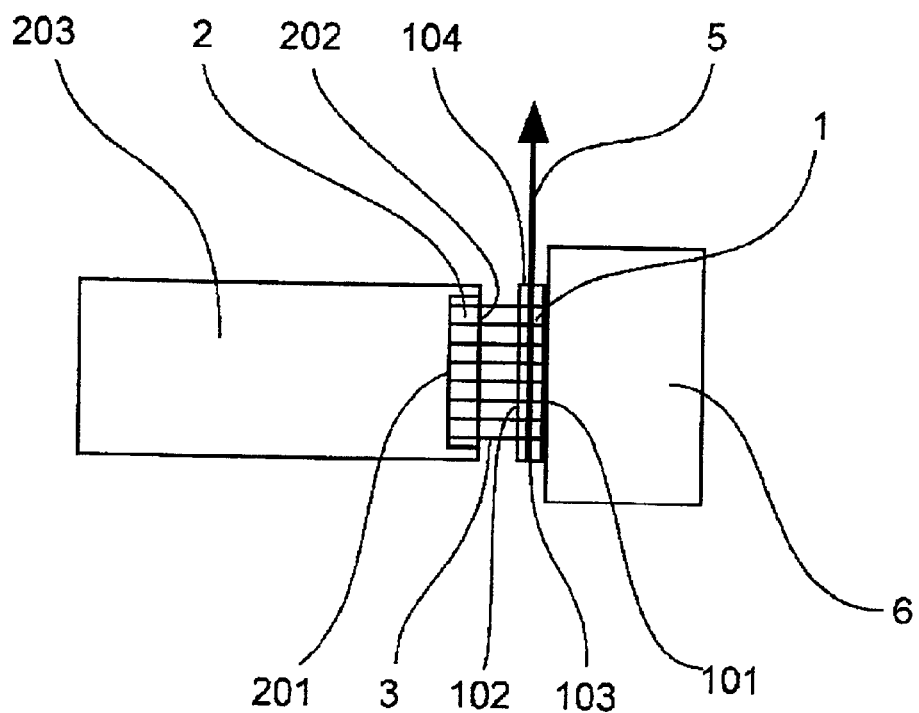
FIG. 1 is a top view showing a structure of an exciting portion of a solid state laser device according to an embodiment 1 of the present invention.

FIG. 1 is a top view showing a structure of an exciting portion of a solid state laser device according to an embodiment 1 of the present invention. In FIG. 1, 1 is a solid state laser element containing an active medium, 2 is a semiconductor laser as an excitation light source, 3 is an excitation light emitted from the semiconductor laser array, 5 is a laser light emitted from the solid state laser element 1, and 6 is a heat sink for cooling the solid state laser element. The solid state laser device of the present embodiment shows such a structure that a thin-plate Yb (Ytterbium)-doped YAG (Yttrium Aluminum Garnet) crystal, which is a three-level laser having an oscillation wavelength of 1030 nm, is employed as the solid state laser element 1.

Also, the semiconductor laser array 2 in which several tens light emitting portions are provided linearly on a single element having a length of 1 cm and which uses InGaAs (Indium Gallium Arsenide) as the active region is employed as the excitation laser. Here, the semiconductor laser array 2 oscillates the laser light of a center wavelength of 940 nm that coincides with the absorption band of the solid state laser element 1. This solid state laser element 1 is arranged in vicinity of the semiconductor laser array 2. In FIG. 1, the vertical direction of the sheet is the optical axis direction of the laser light 5 emitted from the solid state laser element 1, and the horizontal direction thereof is the optical axis direction of the excitation light 3 emitted from the semiconductor laser array 2. The optical axis direction of the semiconductor laser array 2 as the excitation laser and the optical axis direction of the solid state laser element 1 are arranged to intersect orthogonally with each other.

In FIG. 1, 101 is a side of the solid state laser element 1 positioned on the opposite side to the semiconductor laser array 2, to which the high reflection coating to the oscillation wavelength 940 nm of the semiconductor laser array 2 is applied. 102 is a side of the solid state laser element 1 opposing to the semiconductor laser array 2, to which the low reflection coating to the oscillation wavelength 940 nm of the semiconductor laser array 2 is applied. 103 is an end face of the solid state laser element 1 along the longitudinal direction (optical axis direction), to which the high reflection coating to the oscillation wavelength 1030 nm of the solid state laser element 1 is applied. 104 is another end face of the solid state laser element 1 along the longitudinal direction (optical axis direction), to which the partial reflection coating that transmits partially the oscillation wavelength 1030 nm of the solid state laser element 1 is applied.

201 is an end face of the semiconductor laser array 2 positioned on the opposite side to the solid state laser element 1, to which the high reflection coating to the oscillation wavelength 940 nm of the semiconductor laser array 2 is applied. 202 is an end face of the semiconductor laser array 2 opposing to the solid state laser element 1, to which the low reflection coating to the oscillation wavelength 940 nm of the semiconductor laser array 2 is applied. 203 is a heat sink, and the semiconductor laser array 2 is adhered onto the heat sink 203 by the solder via a submount. This heat sink 203 is also used as the anode that drives the semiconductor laser array 2. 6 is a heat sink for cooling the solid state laser element 1. Both the heat sink 203 for cooling the semiconductor laser array 2 and the heat sink 6 for cooling the solid state laser element 1 employ the water cooling system, and thus cooling water paths (not shown) are provided in the insides of the heat sinks 203, 6.

Figure 2:
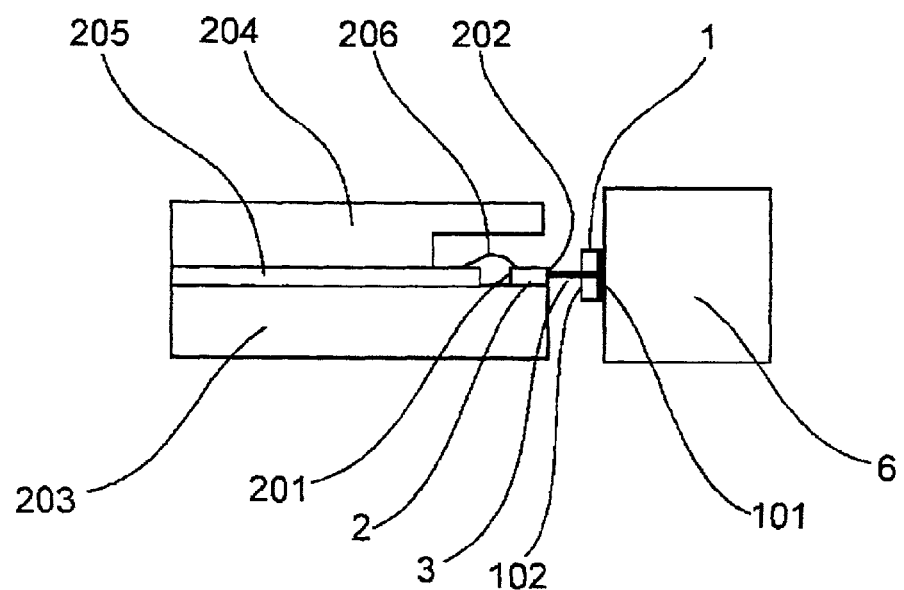
FIG. 2 is a front view showing the structure of the exciting portion of the solid state laser device according to embodiment 1 when viewed from the optical axis direction of the solid state laser element.

FIG. 2 is a front view showing the structure of the exciting portion of the solid state laser device according to the embodiment 1 when viewed from the optical axis direction of the solid state laser element. The direction perpendicular to the sheet corresponds to the laser optical axis direction. In FIG. 2, 204 is a cathode used for power supply to drive the semiconductor laser array 2, 205 is an insulating plate formed of ceramic upper and lower surfaces of which are metallized, and 206 is a metal wire which is passed between an upper surface (n electrode) of the semiconductor laser array 2 and an upper metallized surface of the insulating plate 205. Normally, the semiconductor laser array 2, the heat sink (anode) 203, the cathode 204, the insulating plate 205, and the metal wire 206 are commercially available as the package in which all elements are integrally packaged, as shown in FIG. 2.

Next, an operation of the solid state laser device according to the present embodiment will be explained hereunder. When the current is injected by applying the voltage between the cathode 204 connected electrically to the n-electrode (upper surface) of the semiconductor laser array 2 and the anode 205 connected electrically to the p-electrode (lower surface) of the semiconductor laser array 2, the population inversion is formed in the active region of the semiconductor laser array 2. Thus, the spontaneous emission light is generated around the wavelength 940 nm that corresponds to the energy difference (band gap) between the conduction band and the valence band of the semiconductor constituting the active layer. The so-called external optical resonator for the semiconductor laser array 2 is constructed between the end face 201 of the semiconductor laser array 2 and the side 101 of the solid state laser element 1. In the event that a first optical resonator is mentioned hereinafter, such first optical resonator indicates this external optical resonator and also means the optical resonator in which the excitation light goes back and forth.

The first optical resonator in the present invention is the optical resonator that consists of a pair of resonator mirrors, i.e., the end face 201 of the semiconductor laser array 2 and the side 101 of the solid state laser element 1. A part of the spontaneous emission light is confined in the first optical resonator and also travels reciprocally in the first optical resonator. When the spontaneous emission light that travels reciprocally in the first optical resonator passes through the active layer of the semiconductor laser array 2, such spontaneous emission light is subjected to the amplifying action by the stimulated emission, and thus the light intensity in the first optical resonator is promptly increased and the laser oscillation is started. Since the high reflection coating to 940 nm, that is the oscillation wavelength of the semiconductor laser array 2, is applied to the end face 201 of the semiconductor laser array 2 and the side 101 of the solid state laser element 1 respectively, the optical confinement effect of the excitation light in the first optical resonator becomes strong and thus the excitation light intensity for the wavelength 940 nm in the first optical resonator is extremely increased.

The solid state laser element 1 is provided in the first optical resonator of the solid state laser device in the present embodiment. The excitation laser light 3 of the oscillation wavelength 940 nm of the semiconductor laser array 2 coincides with the absorption band of the solid state laser element 1. For this reason, when the excitation laser light 3 that is emitted from the semiconductor laser array 2 and is confined in the first optical resonator passes through the solid state laser element 1, a part of the excitation laser light 3 is absorbed by the solid state laser element 1 to excite the active medium in the solid state laser element 1. As a result, the population inversion is formed in the solid state laser element 1, so that the spontaneous emission light is generated around the wavelength 1030 nm that corresponds to the energy difference of the population inversion.

The high reflection coating to the oscillation wavelength 1030 nm of the solid state laser element 1 is applied to the end face 103 of the solid state laser element 1 in the longitudinal direction, and the partial reflection coating to the oscillation wavelength 1030 nm of the solid state laser element 1 is applied to the another end face 104. Both constitute the optical resonator for the solid state laser element 1. The optical resonator to the solid state laser light is called a second optical resonator hereinafter. As the result of such coatings, a part of the spontaneous emission light generated in the solid state laser element 1 is confined in the second optical resonator that is constructed between the end faces 103, 104 of the solid state laser element 1, and thus travels reciprocally in the second optical resonator. When the spontaneous emission light passes through the population inversion, such spontaneous emission light is subjected to the amplifying action by the stimulated emission, and thus the light intensity in the second optical resonator is quickly increased. The coherent solid state laser light 5 is grown with the increase of the light intensity, and then the laser oscillation is started. The solid state laser light 5 in the second optical resonator is extracted to the outside of the second optical resonator at the rate that corresponds to the transmittance of the end face 104 of the solid state laser element 1.

Figure 3:
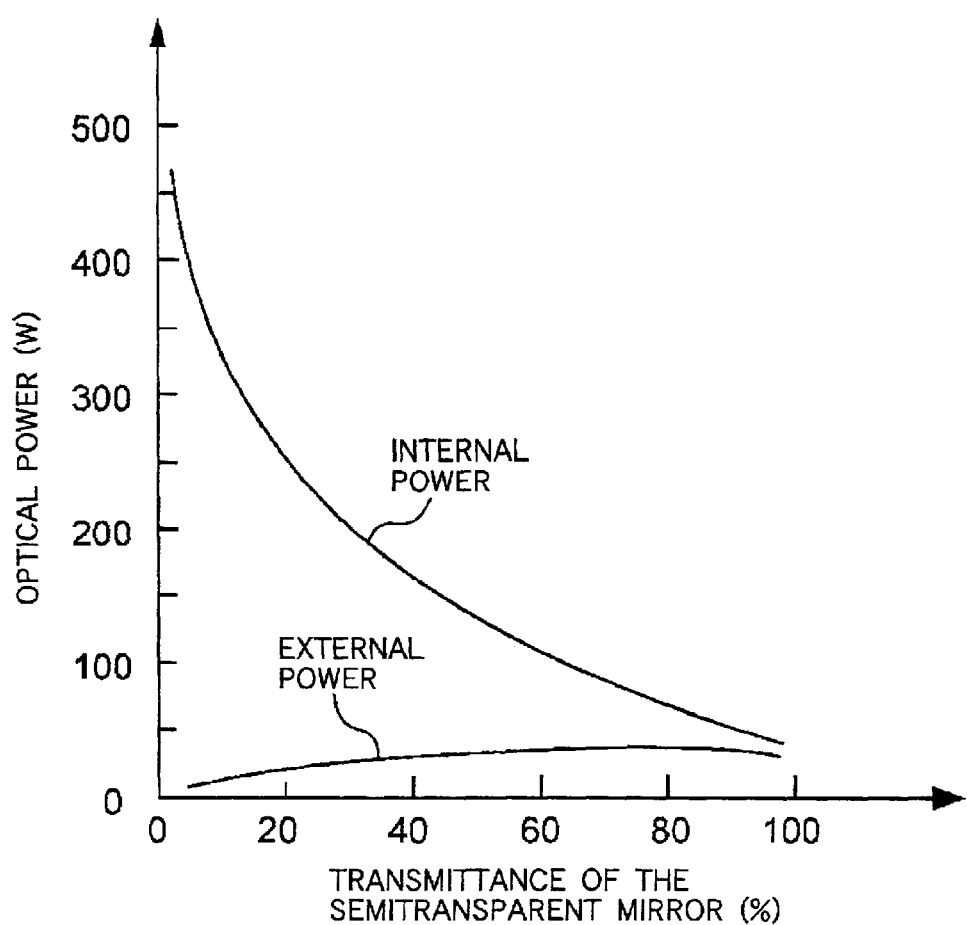
FIG. 3 is a graph showing characteristics of laser power in an optical resonator of a semiconductor laser array and laser power output from the resonator with respect to the transmittance of a partial reflection mirror.

FIG. 3 is a graph showing a comparison of a laser power in the optical resonator consisting of a pair of mirrors formed on both sides of the semiconductor laser array itself (internal power) and a laser power output to the outside of the optical resonator of the semiconductor laser array itself (external power) as characteristics with respect to the transmittance of the partial reflection mirror at the laser light emitting side of the semiconductor laser array. In this case, the characteristics in FIG. 3 are computed values obtained when a constant resonator loss in the optical resonator of the semiconductor laser array itself is assumed.

The dependency of the external power upon the transmittance of the partial reflection mirror is decided by the gain of the laser medium, the above resonator loss, etc. As can be seen from FIG. 3, the optimum value that maximizes the external power exists in the transmittance of the partial reflection mirror. The optimum value of the transmittance of the partial reflection mirror in the semiconductor laser array 2 employed in solid state laser device in the present embodiment is about 85%. In this case, the laser power of about 40 W can be extracted to the outside of the semiconductor laser array 2.

If the external power is assumed as Pout and the transmittance of the partial reflection mirror is assumed as T, the internal power Pin of the semiconductor laser array 2 is approximately given by Eq.(1).

$$Pin=(2/T-1)\times Pout \quad (1)$$

Since the value of the transmittance T is always less than 1 in Eq.(1), the laser power in the semiconductor laser array always becomes higher than the laser power on the outside of the semiconductor laser array. In addition, if the transmittance of the partial reflection mirror is reduced (the reflectance is increased), the intensity of the internal power can be effectively enhanced. In the event that the semiconductor laser array 2 in the solid state laser device in the present embodiment is employed, if the transmittance of the partial reflection mirror is assumed as less than 5%, the excitation light intensity that is large 10 times the maximum value 40 w of the external power can be obtained in the inside of the semiconductor laser array 2.

In the solid state laser device of the present embodiment, the first optical resonator is constructed by the high reflection mirror to the oscillation wavelength 940 nm of the semiconductor laser array 2, so that the excitation light confinement effect into the first optical resonator is emphasized. Therefore, in the structure of the solid state laser device in the present embodiment, it is possible to effectively excite the solid state laser element 1 based on the similar logic since the solid state laser element 1 can be irradiated at the extremely higher light intensity than the case of the conventional structure in which the solid state laser element 1 is arranged on the outside of the first optical resonator.

Figure 4:
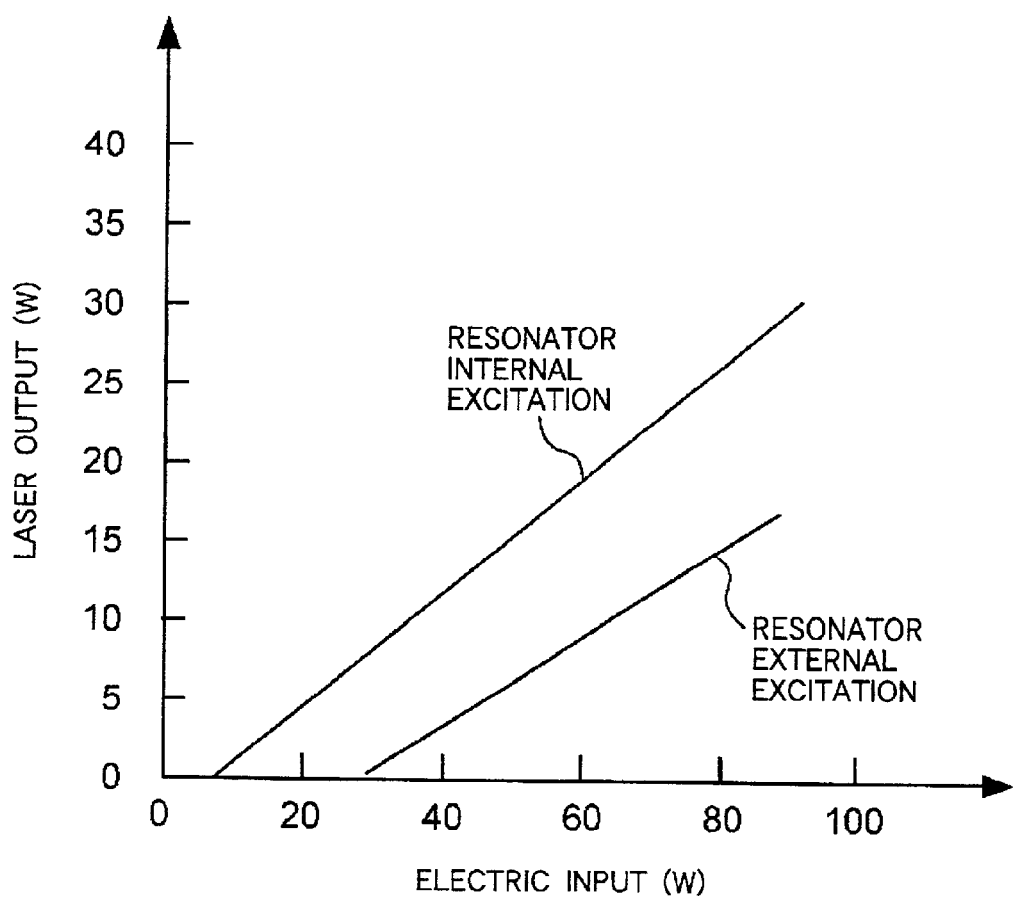
FIG. 4 is a graph showing a comparison of output characteristics between the solid state laser device according to the embodiment 1 and the solid state laser device in the prior art.

FIG. 4 is a graph showing a comparison of output characteristics between the solid state laser device (resonator internal excitation) according to the present embodiment and the conventional solid state laser device (resonator external excitation) in which the solid state laser element is arranged on the outside of the first optical resonator. Since the solid state laser device 1 is provided on the inside of the first optical resonator, it is possible to irradiate the excitation light with the extremely higher light intensity than the structure in which the solid state laser element is arranged on the outside of the first optical resonator in the prior art. As a result, not only the reduction in the threshold value of the laser oscillation but also the sharp improvement in the optical output and the efficiency can be achieved in contrast to the structure in which the solid state laser element is arranged on the outside of the first optical resonator in the prior art. Also, since the solid state laser device 1 is arranged on the inside of the first optical resonator, the solid state laser device of the present embodiment succeeded in generating the laser output of about 30 W at the electric efficiency of more than 30% in response to the maximum electric input 90 W for the semiconductor laser array 2.

As shown in the solid state laser device of the present embodiment, if the solid state laser device 1 is arranged on the inside of the first optical resonator, it is possible to irradiate the excitation light to the solid state laser element at the extremely high excitation light intensity rather than the structure in which the solid state laser element is arranged on the outside of the first optical resonator in the prior art. As a result, the higher output and the higher efficiency of the solid state laser output can be achieved effectively by exciting the solid state laser element effectively.

Also, in the solid state laser device of the present embodiment, since the semiconductor laser is employed as the excitation laser, the resonator length of the excitation laser can be shortened such as almost several mm to several cm. Accordingly, not only the solid state laser device can be constructed compactly but also the solid state laser light can be generated effectively since the efficiency of the semiconductor laser itself is high such as several 10%.

In addition, in the solid state laser device of the present embodiment, since the optical axis of the excitation laser light and the optical axis of the solid state laser element are arranged to intersect orthogonally with each other, adjustment of the optical axis of the excitation laser light to the solid state laser element can be facilitated. Also, if the number of the excitation lasers that are aligned along the optical axis of the solid state laser element is increased, the higher output of the solid state laser light can be easily achieved.

In this case, in the solid state laser device of the present embodiment, the Yb-doped YAG crystal as the three-level laser is employed. Since the three-level laser has small quantum defects and has small heat generation in the excitation, such laser is considered as the solid state laser element which is suitable for the generation of the laser light that has the high latent efficiency and is excellent in the high output operation and the beam quality characteristic. However, such three-level laser has the three-level laser oscillating mechanism, lower levels are always present in the room temperature state, the threshold value is high due to the reabsorption loss, and the solid state laser element must be excited at the very high excitation light intensity to get the laser oscillation. Therefore, in the solid state laser device in the prior art, if the solid state laser element having the three-level laser oscillating mechanism is employed, it is difficult to carry out the laser oscillation effectively.

However, in the solid state laser device of the present embodiment, since the solid state laser device 1 is arranged on the inside of the first optical resonator, it is feasible to obtain the very high excitation light intensity easily. Accordingly, even if the solid state laser element having the three-level laser oscillating mechanism is employed, the solid state laser light can be generated effectively. In addition, since the three-level laser has small heat generation, the solid state laser device 1 can be cooled sufficiently by the indirect cooling system in which the solid state laser device 1 is arranged on the heat sink 6, and the thermal distortion generated in the solid state laser device 1 can be suppressed to the lowest minimum, and also the laser light that is excellent in the beam quality can be effectively generated.

Also, like the solid state laser device of the present embodiment, in the structure in which the first optical resonator is constructed by the mirror with the high reflectance to the excitation light wavelength, the solid state laser element is arranged on the inside of the first optical resonator, and the solid state laser light is extracted to the outside of the second optical resonator, it can be regarded that the excitation optical power absorbed by the solid state laser element is equivalent to the external power in the normal optical resonator using the partial reflection mirror. Thus, the excitation light absorption rate of the solid state laser element corresponds to the transmittance of the partial reflection mirror in the normal optical resonator structure using the partial reflection mirror. As a result, the maximum value to maximize an absorption amount of the excitation light is present in the absorption rate of the solid state laser element.

The excitation light absorption rate of the solid state laser element can be adjusted arbitrarily by controlling the density of the active medium, the thickness of the solid state laser element to pass the excitation light, and the wavelength of the excitation light. If the density of the active medium, the thickness of the solid state laser element, and the wavelength of the excitation light are adjusted to maximize the absorption amount of the excitation light in response to the characteristics of the excitation laser, the generation efficiency of the solid state laser light can be improved.

The excitation optical power on the inside of the first optical resonator is changed according to the absorption rate of the excitation light of the solid state laser element 1 that is arranged on the inside of the first optical resonator. For example, when the absorption rate of the excitation light is reduced, the excitation light intensity on the inside of the first optical resonator is increased. Therefore, by placing a solid state laser element in the first optical resonator and irradiating the solid state element with the high excitation light intensity, it is possible to generate the solid state laser light effectively from the solid state laser element, even though the thickness of the solid state laser element is too small to absorb the excitation light sufficiently in case that the solid laser element is arranged on the outside of the first optical resonator as shown in the prior art.

Also, in the solid state laser device of the present embodiment, the solid state laser element 1 as the excited object is constructed to be used as one mirror of the first optical resonator by applying the high reflection coating to the excitation laser light to the side 101 of the solid state laser element 1. Therefore, not only the number of parts of the solid state laser device can be reduced and the production cost becomes inexpensive but also the solid state laser device can be constructed simply in compact and the excitation light can be irradiated to the solid state laser element 1 without fail. In addition, there is the advantaged that, since only the position/direction of the solid state laser element 1 must be adjusted to the semiconductor laser array 2 as the excitation laser, the assembling/adjustment can be facilitated.

In addition, in the solid state laser device of the present embodiment, the solid state laser element 1 itself is also used as a pair of mirrors in the second optical resonator to output the solid state laser light by applying the high reflection coating and the partial reflection coating to the solid state laser light to both end faces 103, 104 that correspond to the optical axis direction of the solid state laser element 1 respectively. Therefore, not only adjustment and alignment of the mirrors constituting the second optical resonator to the solid state laser element 1 can be omitted but also miniaturization of the overall solid state laser device can be achieved. In addition, since there is no necessity that the optical resonator mirrors should be used separately from the solid state laser element 1, the production cost of the solid state laser device can be reduced.

Also, since the solid state laser element 1 is arranged on the inside of the first optical resonator, the excitation region in the solid state laser element 1 can be limited in the modes of the first optical resonator. Therefore, not only the high gain can be obtained in the solid state laser element 1 and the stable solid state laser output can always be obtained, but also the solid state laser light that is excellent in the light beam quality can be generated easily by selecting the mode of the solid state laser light in response to the gain region since the gain is concentrated in the relatively narrow region.
(Embodiment 2)

Figure 5:
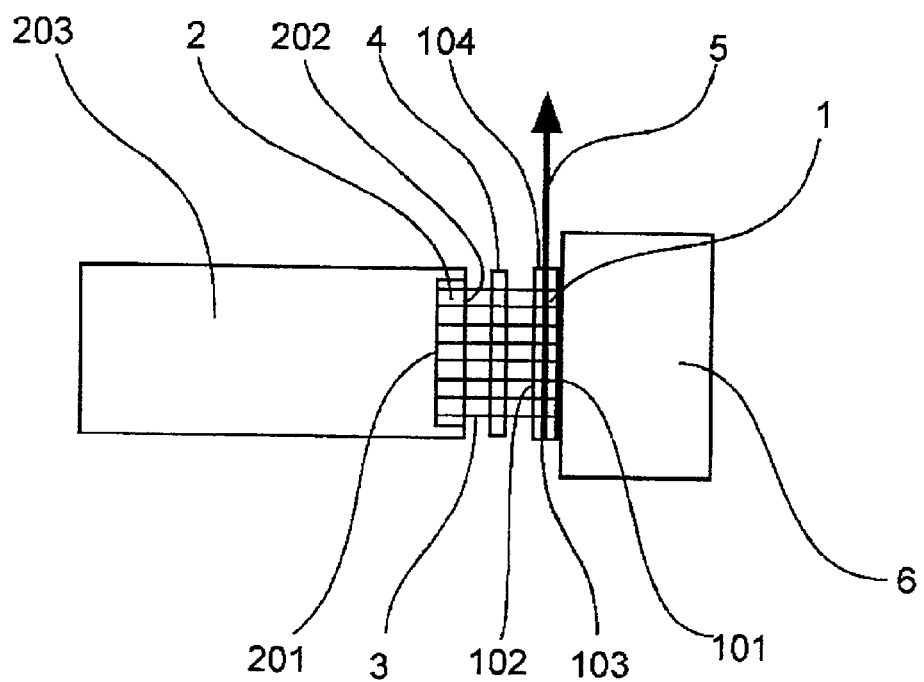
FIG. 5 is a top view showing a structure of an exciting portion of a solid state laser device according to an embodiment 2 of the present invention.

FIG. 5 is a top view showing a structure of an exciting portion of a solid state laser device according to an embodiment 2 of the present invention. In FIG. 5, the same symbols as those in FIG. 1 denote the same parts or the equivalent parts. In the solid state laser device of the present embodiment, an optical element 4 consisting of an aspherical cylindrical lens is arranged between the solid state laser element 1 and the semiconductor laser array 2.

Figure 6:
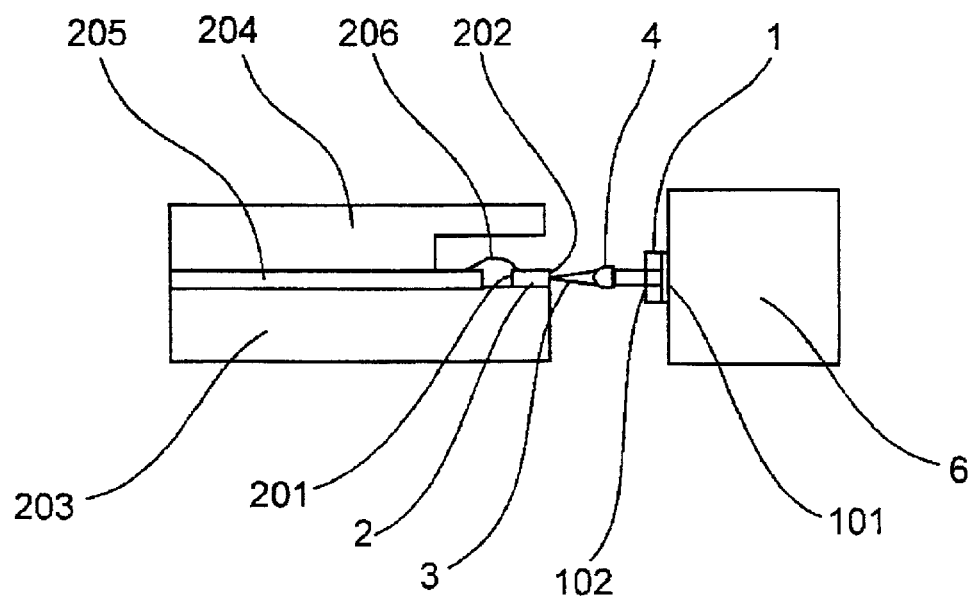
FIG. 6 is a front view showing the structure of the exciting portion of the solid state laser device according to the embodiment 2 when viewed from the optical axis direction of the solid state laser element.

FIG. 6 is a front view showing the structure of the exciting portion of the solid state laser device according to the embodiment 2 when viewed from the optical axis direction of the solid state laser element. In the solid state laser device of the present embodiment, like the embodiment 1, the first optical resonator is constructed by applying the high reflection coating to the oscillation wavelength of the semiconductor laser array 2 to the end face 201 of the semiconductor laser array 2 positioned on the opposite side to the solid state laser element 1 and the side 101 of the solid state laser element 1 positioned on the opposite side to the semiconductor laser array 2 respectively. In the solid state laser device of the present embodiment, the mode pattern of the excitation light in the first optical resonator is shaped by arranging the optical element 4 consisting of the aspherical cylindrical lens between the solid state laser element 1 and the semiconductor laser array 2.

The excitation light 3 is confined in the waveguide layer with a width of about 1 $\mu$m in the semiconductor laser array 2. As a result, the excitation light 3 emitted from the end face 202 of the semiconductor laser array 2 to the free space exhibits the property that such light expands in the direction perpendicular to the active layer of the semiconductor laser array 2, that corresponds to the vertical direction of the sheet in FIG. 6, due to the strong diffraction effect. Accordingly, in order to get the stable laser oscillation by constructing the external optical resonator for the semiconductor laser array while using the normal flat mirrors, etc., the flat mirrors must be arranged in vicinity of the semiconductor laser array.

In the solid state laser device of the present embodiment, the excitation light 3 emitted from the semiconductor laser array 2 is converted into a substantially parallel light by inserting the optical element 4 consisting of the aspherical cylindrical lens into the first optical resonator, and is then irradiated to the solid state laser element 1. Therefore, even if a distance between the end face 201 of the semiconductor laser array 2 and the side 101 of the solid state laser element 1, that constitute a pair of mirrors of the first optical resonator respectively, is set large, the increase in loss of the first optical resonator can be suppressed and the stability of the first optical resonator can be improved, and thus the stable solid state laser output can be obtained. Accordingly, not only the advantage similar to the above embodiment 1 can be achieved, but also the alignment precision of the solid state laser element 1 to the semiconductor laser array 2 can be relaxed since there is no need that the solid state laser element 1 should be arranged in vicinity of the semiconductor laser array 2, so that assembling/adjustment of the solid state laser device can be easily carried out.

In addition, since the mode pattern of the excitation light 3 in the first optical resonator can be changed arbitrarily by changing the shape, the focal length, the alignment position, etc. of the optical element 4 to adjust the irradiation region on the solid state laser element 1, the selection of tranverse mode of the solid state laser element 1 can be made easily.
(Embodiment 3)

Figure 7:
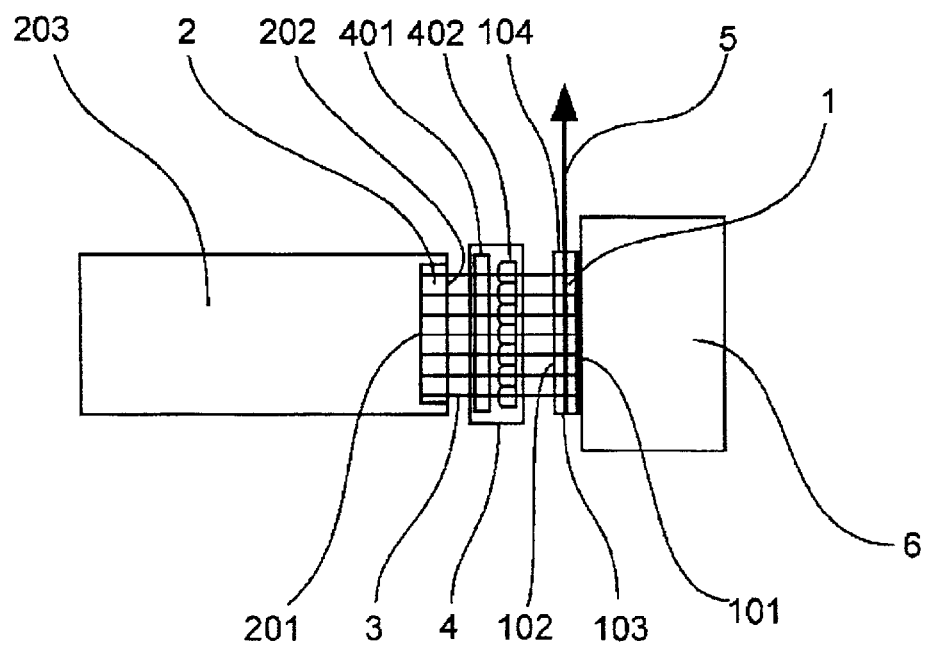
FIG. 7 is a top view showing a structure of an exciting portion of a solid state laser device according to an embodiment 3 of the present invention.

FIG. 7 is a top view showing a structure of an exciting portion of a solid state laser device according to an embodiment 3 of the present invention. In the solid state laser device of the present embodiment, like the embodiment 1 or 2, the first optical resonator for the excitation light is constructed by applying the high reflection coating to the oscillation wavelength of the semiconductor laser array 2 to the end face 201 of the semiconductor laser array 2 and the side 101 of the solid state laser element 1 respectively. In FIG. 7, 401 is an optical element for correcting a mode pattern of the excitation light 3 in the direction perpendicular to the active layer of the semiconductor laser array 2 like the optical element 4 shown in the embodiment 2, and 402 is an optical element constructed by a microlens array arranged to respond to a number of light emitting portions in the semiconductor laser array 2, for correcting a mode pattern of the excitation light 3 in the vertical direction of FIG. 7, i.e., the direction parallel with the active layer of the semiconductor laser array 2.

The excitation light emitted from the semiconductor laser array 2 tends to extend in not only the direction perpendicular to the active layer but also the direction parallel with the active layer. According to the solid state laser device of the present embodiment, because the excitation light is converged into a parallel light in the direction parallel with the active layer by the optical element 402 arranged to respond to respective light emitting portions in the semiconductor laser array 2, the stability of the first optical resonator for the excitation light can be improved further more and also the solid state laser light can be generated stably and effectively.

The solid state laser device of the present embodiment uses two optical elements 401, 402 for collimating the excitation light mode both in parallel and perpendicular directions to the active layer of the semiconductor laser array 2. If the self-imaging optical system is constructed by using the optical elements 401, 402 such that the excitation light distribution on the end face 202 of the semiconductor laser array 2 is imaged on the end face 202 of the semiconductor laser array 2 after the excitation light travels reciprocally in the first optical resonator, the more stable oscillation of the excitation laser can be obtained.

(Embodiment 4)

Figure 8:
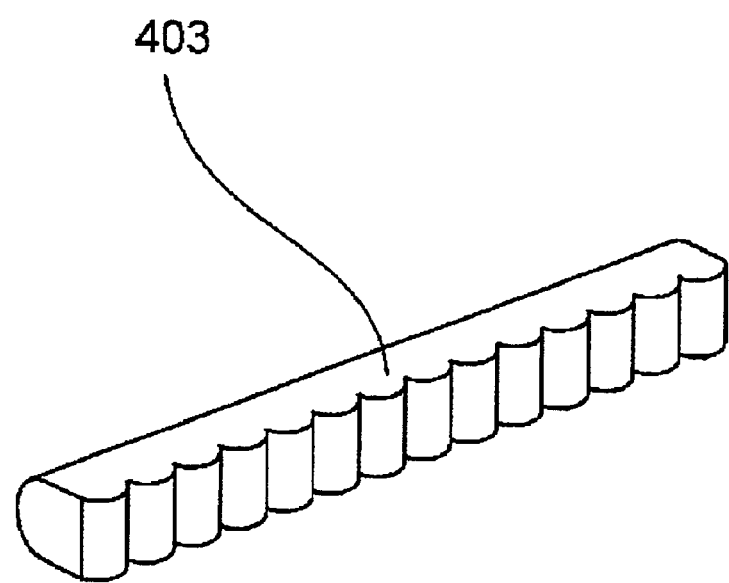
FIG. 8 is a perspective view showing a mode pattern correcting optical element according to an embodiment 4 of the present invention.

In the above embodiment 3, the structure in which the optical elements 401, 402 are separately used to correct the mode patterns in the directions perpendicular to and parallel with the active layer of the semiconductor laser array 2 is shown. As shown in FIG. 8, if an optical element 403 whose incident surface is constructed by a cylindrical surface that is parallel with the active layer direction and whose outgoing surface is constructed by cylindrical surfaces that are perpendicular to a plurality of active layers to respond to respective light emitting portions of the semiconductor laser array 2 is used as the mode pattern correcting optical element, both the mode pattern correction in the direction parallel with the active layer of the semiconductor laser array 2 and the mode pattern correction in the direction perpendicular to the active layer can be carried out by the single optical element 403. Therefore, not only the advantage similar to the embodiment 3 can be achieved but also alignment/adjustment of the mode pattern correcting optical element inserted into the optical resonator of the semiconductor laser array 2 can be simplified.

(Embodiment 5)

Figure 9:
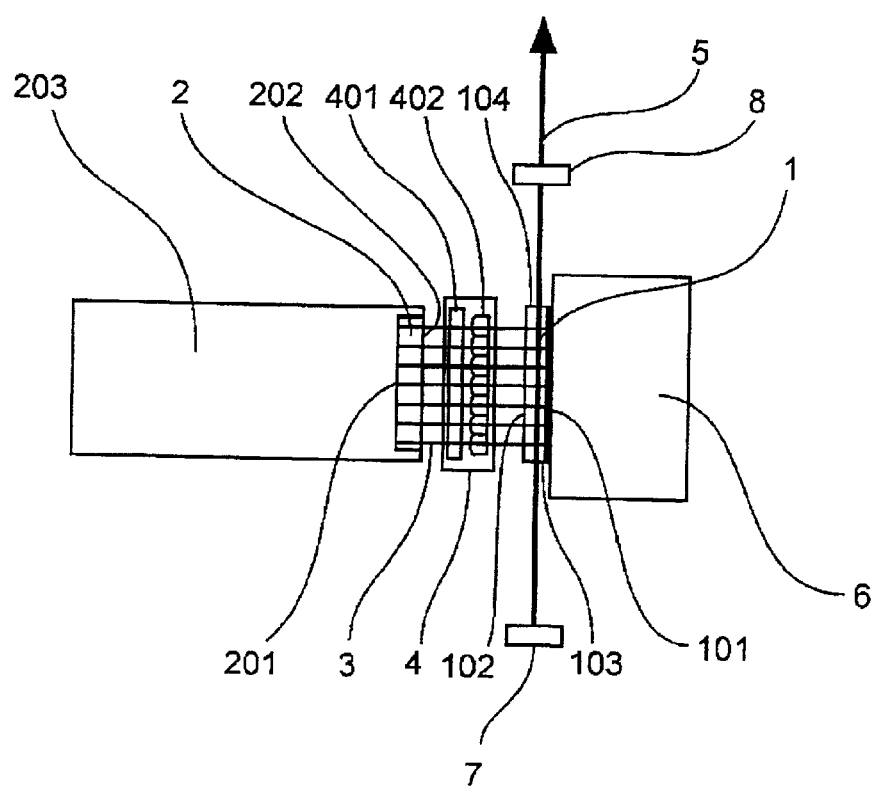
FIG. 9 is a top view showing a structure of an exciting portion of a solid state laser device according to an embodiment 5 of the present invention.

FIG. 9 is a top view showing a structure of an exciting portion of a solid state laser device according to an embodiment 5 of the present invention. In the solid state laser device of the present embodiment, the first optical resonator for the excitation light is constructed by applying the high reflection coating to the oscillation wavelength of the semiconductor laser array 2 to the end face 201 of the semiconductor laser array 2 and the side 101 of the solid state laser element 1 respectively. Also, like the above embodiment 3, the mode patterns of the excitation light in both directions that are perpendicular to and parallel with the active layer of the semiconductor laser array 2 are corrected by inserting two optical elements 401, 402 into the first optical resonator.

In the solid state laser device of the present embodiment, the second optical resonator to output the solid state laser light from the solid state laser element 1 is constructed by arranging a high reflection mirror 7 to the wavelength 1030 nm of the solid state laser light and a partial reflection mirror 8 on the outside of the solid state laser element 1. Also, the low reflection coating to the wavelength 1030 nm of the solid state laser light is applied on both end faces 103, 104 of the solid state laser element 1 in the longitudinal direction (optical axis direction) respectively.

As shown in the solid state laser device of the present embodiment, if the second optical resonator is constructed by arranging the high reflection mirror 7 and the partial reflection mirror 8 on the outside of the solid state laser element 1, the resonator length and the mirrors used in the resonator can be changed simply and thus adjustment of the mode and the beam quality of the solid state laser light 5 can be easily carried out. In addition, it is possible to adjust angles of the high reflection mirror 7 and the partial reflection mirror 8 constituting the second optical resonator. Therefore, even if the optical axis of the solid state laser light 5 is changed due to the heat generation, etc. in the solid state laser element 1, the solid state laser light 5 can always be output effectively and stably from the solid state laser element 1 by adjusting the alignment angles of the high reflection mirror 7 and the partial reflection mirror 8 into the optimum angles that can maximize the optical output of the solid state laser light 5.

Also, the change of the reflectance of the partial reflection mirror 8 constituting the second optical resonator can be simply achieved. Therefore, even if the gain of the solid state laser element 1 is changed by exchanging the excitation laser, etc., the solid state laser light 5 can be output effectively by changing the reflectance of the partial reflection mirror 8 into the reflectance that can maximize the optical output of the solid state laser light 5.

In addition, since only one type of the low reflection coating to the solid state laser light 5 may be applied to both end faces 103, 104 of the solid state laser element 1, the reduction of the production cost of the solid state laser element 1 can be attained.

In all the above embodiment, the stable optical resonator that consists of the high reflection mirror and the partial reflection mirror is used as the second optical resonator for extracting the solid state laser light 5. But the structure of the second optical resonator is not limited to this structure at all. For example, if the unstable optical resonator is employed, the solid state laser light 5 with good beam quality can be generated more easily.

(Embodiment 6)

Figure 10:
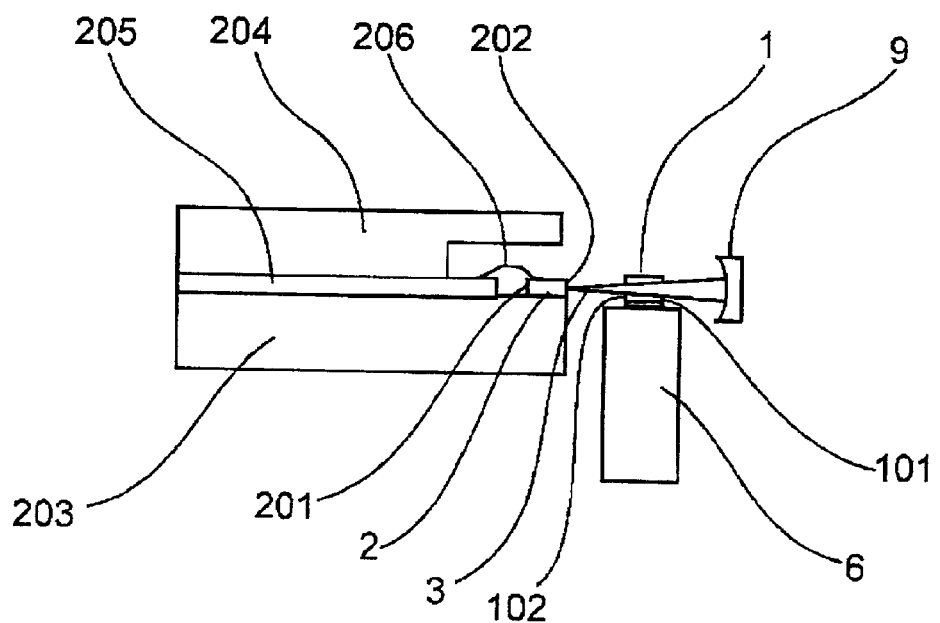
FIG. 10 is a front view showing a structure of an exciting portion of a solid state laser device according to an embodiment 6 of the present invention when viewed from the optical axis direction of the solid state laser element.

FIG. 10 is a front view showing a structure of an exciting portion of a solid state laser device according to an embodiment 6 of the present invention when viewed from the optical axis direction of the solid state laser element 1. In the solid state laser device of the present embodiment, the first optical resonator for the excitation light is constructed by the end face 201 of the semiconductor laser array 2 and a high reflection mirror 9 that has a concave cylindrical surface and is arranged at the position that oppose to the semiconductor laser array 2 to put the solid state laser element 1 between them. The high reflection coating to the oscillation wavelength 940 nm of the semiconductor laser array 2 is applied to the high reflection mirror 9. Also, the low reflection coating to the oscillation wavelength 940 nm of the semiconductor laser array 2 is applied to both sides 101, 102 of the solid state laser element 1 respectively.

As shown in the solid state laser device of the present embodiment, if the high reflection mirror 9 constituting the first optical resonator is employed separately from the solid state laser element 1, the precisions for the alignment position and the angle of the solid state laser element 1 to the semiconductor laser array 2 can be widely relaxed. Therefore, the assembling/adjustment of the solid state laser device can be carried out more simply. In addition, the position and the angle of the high reflection mirror 9 can be adjusted easily. Therefore, even if deviation in the position or the angle of the solid state laser element 1 is caused, the solid state laser element 1 can always be excited effectively by adjusting the concave cylindrical mirror 9 such that the excitation light intensity in the first optical resonator can be maximized.

Also, since only the low reflection coating to the excitation light wavelength may be applied to the side of the solid state laser element 1, the reduction of the production cost of the solid state laser element 1 can be achieved.

(Embodiment 7)

Figure 11:
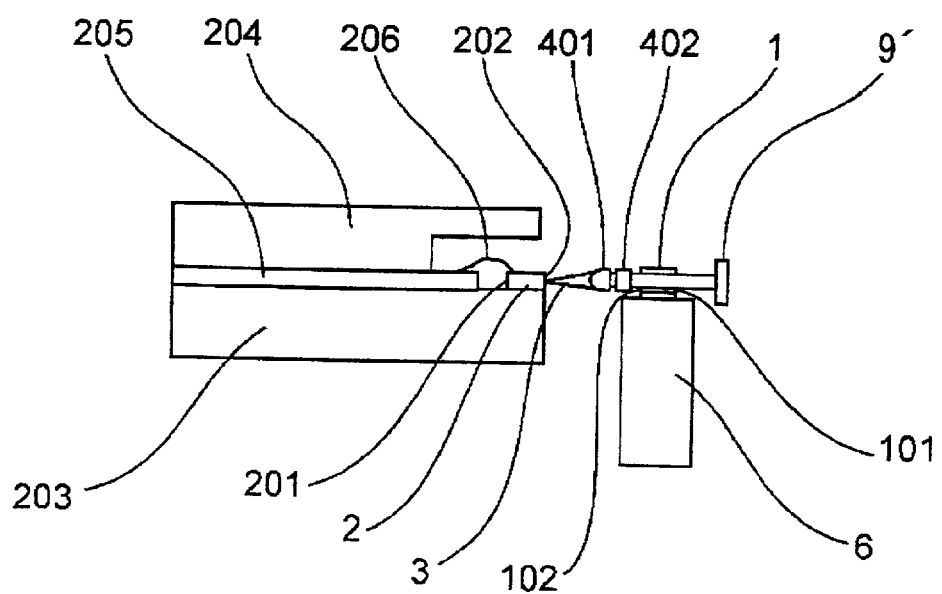
FIG. 11 is a front view showing a structure of an exciting portion of a solid state laser device according to an embodiment 7 of the present invention when viewed from the optical axis direction of the solid state laser element.

FIG. 11 is a front view showing a structure of an exciting portion of a solid state laser device according to an embodiment 7 of the present invention when viewed from the optical axis direction of the solid state laser element 1. In the solid state laser device of the present embodiment, the high reflection mirror 9' is arranged on the outside of the solid state laser element 1 and the first optical resonator is constructed by the high reflection mirror 9' and the end face 201 of the semiconductor laser array 2. Also, like the above embodiment 6, the high reflection coating to the oscillation wavelength 940 nm of the semiconductor laser array 2 is applied to the high reflection mirror 9', and the low reflection coating to the oscillation wavelength 940 nm of the semiconductor laser array 2 is applied to both sides 101, 102 of the solid state laser element 1.

In the solid state laser device of the present embodiment, the optical elements 401, 402 for changing the mode patterns of the excitation light 3 into the parallel light in both directions that are perpendicular to and parallel with the active layer of the semiconductor laser array 2 respectively are inserted into the inside of the first optical resonator that is constructed by the end face 201 of the semiconductor laser array 2 and the high reflection mirror 9' to the excitation light. Also, the flat mirror is employed as the high reflection mirror 9'.

In the solid state laser device of the present embodiment, since the high reflection mirror 9' constituting the first optical resonator for the excitation light 3 is provided on the outside of the solid state laser element 1, it is needless to say that the similar advantage to the above embodiment 6 can be achieved. In addition, since the optical elements 401, 402 for changing the mode patterns of the excitation light 3 into the parallel light are inserted between the semiconductor laser array 2 and the solid state laser element 1, it is not needed that the solid state laser element 1 and the high reflection mirror 9' should be arranged in vicinity of the semiconductor laser array 2. Therefore, assembling/adjustment of the solid state laser device can be made easy and the stability of the first optical resonator for the excitation light 3 can be improved and thus the stable solid state laser output can be obtained.

(Embodiment 8)

Figure 12:
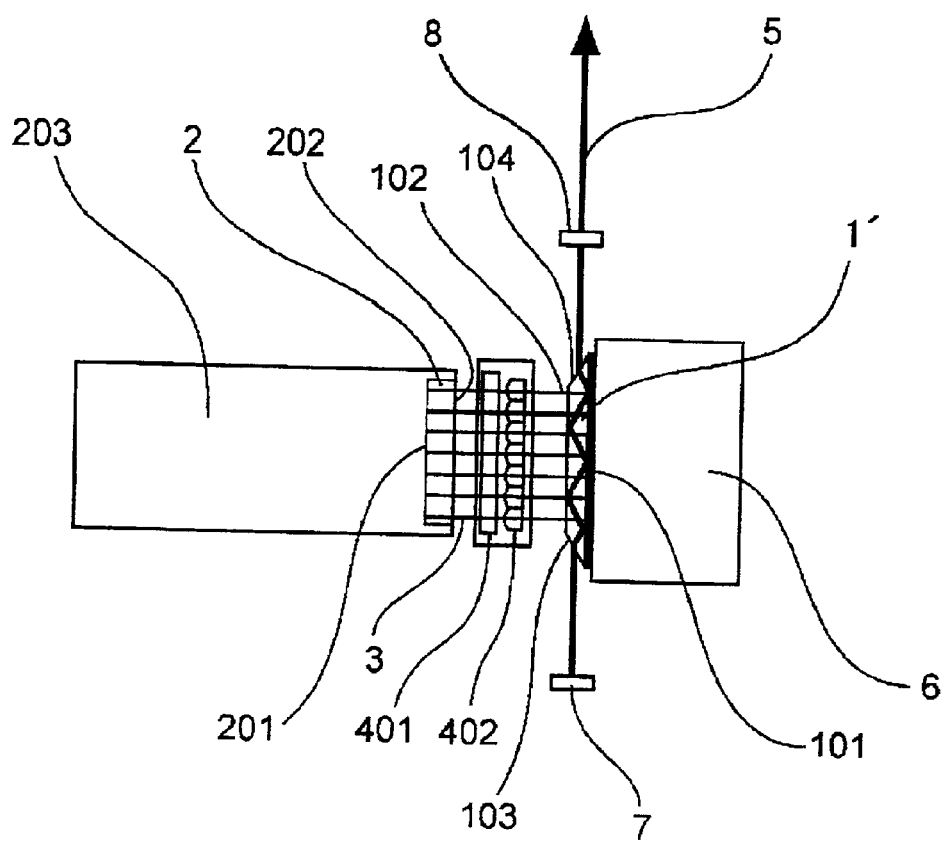
FIG. 12 is a top view showing a structure of an exciting portion of a solid state laser device according to an embodiment 8 of the present invention.

FIG. 12 is a top view showing a structure of an exciting portion of a solid state laser device according to an embodiment 8 of the present invention. In the solid state laser device of the present embodiment, a Nd (Neodymium)-doped YAG crystal that has a four-level laser oscillating mechanism to oscillate at the wavelength 1064 nm is employed as the solid state laser element 1'. Both end faces 103, 104 of the solid state laser element 1' in the longitudinal direction are formed to have the Brewster angle to the optical axis of the solid state laser light 5 at the wavelength 1064 nm. Also, the semiconductor laser array 2 containing AlGaAs (Aluminum Gallium Arsenide), that oscillates at the wavelength 808 nm which coincides with the absorption band of the solid state laser element 1', as the principal component is employed as the excitation laser.

In the solid state laser device of the present embodiment, the first optical resonator for the excitation light is constructed by applying the high reflection coating to the oscillation wavelength 808 nm of the semiconductor laser array 2 to the end face 201 of the semiconductor laser array 2 and the side 101 of the solid state laser element 1' respectively. Also, the low reflection coating to the oscillation wavelength 808 nm of the semiconductor laser array 2 is applied to the end face 202 of the semiconductor laser array 2 and the side 102 of the solid state laser element 1' respectively. In the solid state laser device of the present embodiment, the stable oscillation of the semiconductor laser array 2 serving as the excitation laser is realized by inserting the two optical elements 401, 402 between the semiconductor laser array 2 and the solid state laser element 1' for collimating the exciting light mode.

In the solid state laser device of the present embodiment, the second optical resonator to extract the solid state laser light 5 from the solid state laser element 1' is constructed by arranging the high reflection mirror 7 and the partial reflection mirror 8 to the wavelength 1064 nm of the solid state laser light on the outside of the solid state laser element 1'. Also, both end faces 103, 104 of the solid state laser element 1', that are formed to have the Brewster angle to the longitudinal direction (optical axis direction), are finished by the optical polishing, but the optical film coating is not applied to them. In the solid state laser device of the present embodiment, since both end faces 103, 104 of the solid state laser element 1' are formed to have the Brewster angle, the solid state laser light 5 is irradiated obliquely to both end faces 103, 104 of the solid state laser element 1. As a result, the traveling direction of the solid state laser light 5 is bent by the sides 103, 104 of the solid state laser element 1', and the solid state laser light 5 propagates in a zig-zag optical path while repeating the total reflection between side surfaces 101, 102 in the solid state laser element 1'.

Normally the relaxation process contains the nonradiative transition when the solid state laser element is optically excited. Therefore, it is impossible to avoid the heat generation in the solid state laser element. In particular, in the four-level laser as shown in the solid state laser device in the present embodiment, since the quantum defect is increased rather than the three-level laser and also an amount of heat generation is increased, the influence of the heat generation in the solid state laser element on the optical characteristics becomes conspicuous.

As shown in the solid state laser device of the present embodiment, if the solid state laser element 1' is indirectly cooled from the side 101 by the heat sink 6, the temperature gradient such that the temperature is increased from the side 101 to the side 102 of the solid state laser element 1' is generated because of the heat generation in the solid state laser element 1'. The refractive index of the solid state laser element 1' is changed according to the temperature. Therefore, in the case of the Nd-doped YAG crystal used in the solid state laser device of the present embodiment, since such YAG crystal has the positive gradient of the refractive index with respect to the temperature, the refractive index distribution in which the refractive index is increased from the side 101 toward the side 102 is formed when the solid state laser element 1' is optically excited. In the optical resonator structure in which the optical path of the solid state laser light 5 is previously set such that the solid state laser light 5 travels through the solid state laser element 1' in a straight line, there is the problem that, since the ray of light has the property to bend its traveling direction from the low refractive index side to the high refractive index side, the high diffraction loss is caused to lower the optical output and also the beam beam quality is degraded.

In the solid state laser device of the present embodiment, since the solid state laser light 5 propagates through the solid state laser element 1' in the zig-zag optical path, the optical influence of the refractive index distribution upon the solid state laser light 5 is canceled by the propagation of light from the side 101 to the side 102 of the solid state laser element 1' and the propagation of light from the side 102 to the side 101 thereof. As a result, even if the refractive index distribution is caused by the heat generation of the solid state laser element 1', the stable and highly efficient laser oscillation can be attained while maintaining the high beam quality.

Also, in the solid state laser device of the present embodiment, both end faces 103, 104 of the solid state laser element 1' are formed to have the Brewster angle to the oscillation wavelength 1064 nm of the solid state laser light 5. Therefore, the reflectance of the polarized light that is parallel with the sheet (P polarization) in FIG. 12 on the end faces 103, 104 of the solid state laser element 1' theoretically becomes 0.

In contrast, the reflectance of the polarized light that is perpendicular to the sheet (S polarization) on the end faces 103, 104 of the solid state laser element 1' does not become 0. Accordingly, difference in the optical loss at one round trip of the optical resonator is caused between the polarized light that is parallel to the sheet (P polarization) and the polarized light that is perpendicular to the sheet (S polarization). As a result, since the polarized light that is parallel with the sheet and has the small optical loss (P polarization) oscillates preferentially, the linearly-polarized oscillation can be simply obtained if the end faces 103, 104 of the solid state laser element 1' are formed to have the Brewster angle to the solid state laser light.

Also, the reflectance of the polarized light that oscillates preferentially in the second optical resonator and is parallel with the sheet (P polarization) becomes 0 on the end faces 103, 104 of the solid state laser element 1'. Therefore, there is no need to apply the low reflection coating, that prevents the reflection loss, to the end faces 103, 104 of the solid state laser element 1'. As a result, not only the reduction of the production cost of the solid state laser element 1' can be attained but also the light resistant strength of the end faces 103, 104 of the solid state laser element 1' can be enhanced to thus improve the reliability of the solid state laser device.

(Embodiment 9)

Figure 13:
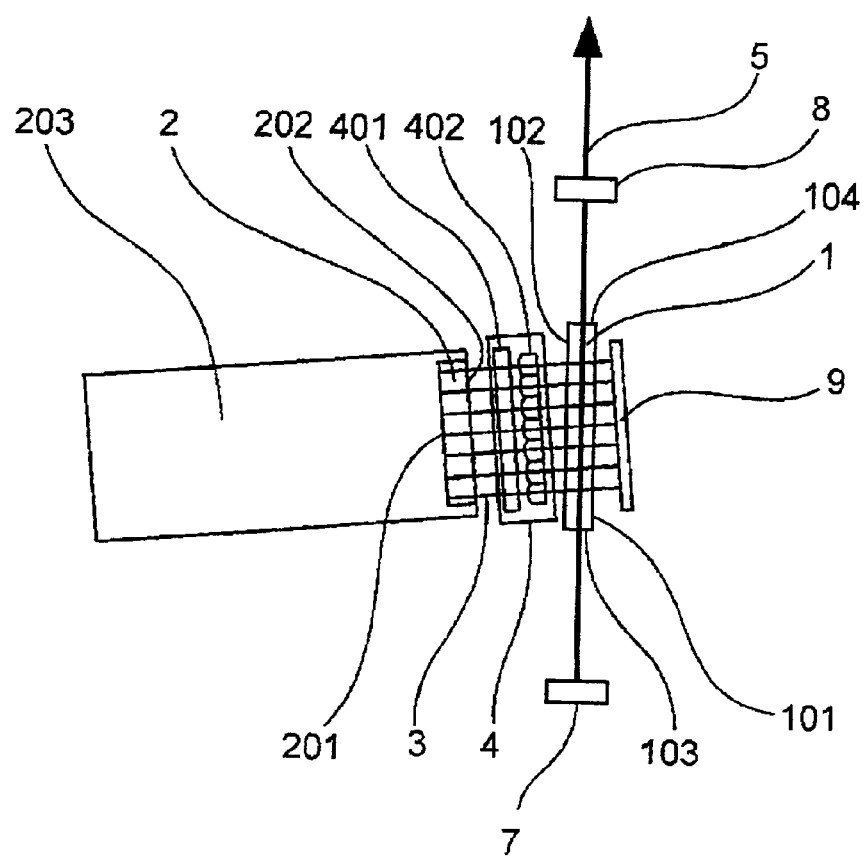
FIG. 13 is a top view showing a structure of an exciting portion of a solid state laser device according to an embodiment 9 of the present invention.

FIG. 13 is a top view showing a structure of an exciting portion of a solid state laser device according to an embodiment 9 of the present invention. In the solid state laser device of the present embodiment, the high reflection mirror 9 is arranged at the position that opposes to the semiconductor laser array 2 to put the solid state laser element 1 between them, and the high reflection mirror 9 and the end face 201 of the semiconductor laser array 2 constitute the first optical resonator. The optical axis of the semiconductor laser array 2 serving as the excitation laser is arranged obliquely to the optical axis of the solid state laser element 1.

In this case, in the solid state laser device of the present embodiment, the high reflection coating to the oscillation wavelength of the semiconductor laser array 2 is applied to the end face 201 of the semiconductor laser array 2 and the high reflection mirror 9 respectively, and also the low reflection coating to the oscillation wavelength of the semiconductor laser array 2 is applied to both sides 101, 102 of the solid state laser element 1 respectively. Also, the mode patterns of the excitation light 3 are adjusted in the directions that are perpendicular to and parallel with the active layer of the semiconductor laser array 2 respectively by inserting the optical elements 401, 402 between the semiconductor laser array 2 and the solid state laser element 1.

Also, in the solid state laser device of the present embodiment, the second optical resonator to extract the solid state laser light from the solid state laser element 1 is constructed by arranging the high reflection mirror 7 to the wavelength of the solid state laser light and the partial reflection mirror 8 on the outside of the solid state laser element 1. The low reflection coating to the wavelength of the solid state laser light is applied to both end faces 103, 104 of the solid state laser element 1 in the longitudinal direction (optical axis direction) respectively.

In the solid state laser device of the present embodiment, the low reflection coating to the oscillation wavelength of the semiconductor laser array 2 is applied to the sides 101, 102 of the solid state laser element 1, nevertheless it is difficult to reduce perfectly the reflection of the excitation light 3 on the sides 101, 102 of the solid state laser element 1 to 0 by the coating. Accordingly, it is impossible to avoid the partial reflection of the excitation light 3 on the sides 101, 102 of the solid state laser element 1. If the reflected light from the side 101 of the solid state laser element 1 returns again to the inside of the semiconductor laser array 2, the number of the population inversion in the semiconductor laser array 2 is changed and therefore there is the possibility that the unstable laser oscillation is caused.

In the solid state laser device of the present embodiment, the optical axis direction of the semiconductor laser array 2 serving as the excitation laser is arranged obliquely to the optical axis direction of the solid state laser element 1. Therefore, the returning of the reflected light from the side of the solid state laser element 1 into the semiconductor laser array 2 can be prevented. As a result, the oscillation of the excitation laser can always be stably maintained, and thus the stable solid state laser light 5 can be generated effectively.

Also, according to the solid state laser device of the present embodiment, the reflected light from the side of the solid state laser element is never returned to the inside of the excitation laser. Therefore, in the inexpensive structure in which the coating is not applied to the sides of the solid state laser element, the stable oscillation of the excitation laser can be maintained and also the solid state laser light can be generated effectively and stably.

(Embodiment 10)

Figure 14:
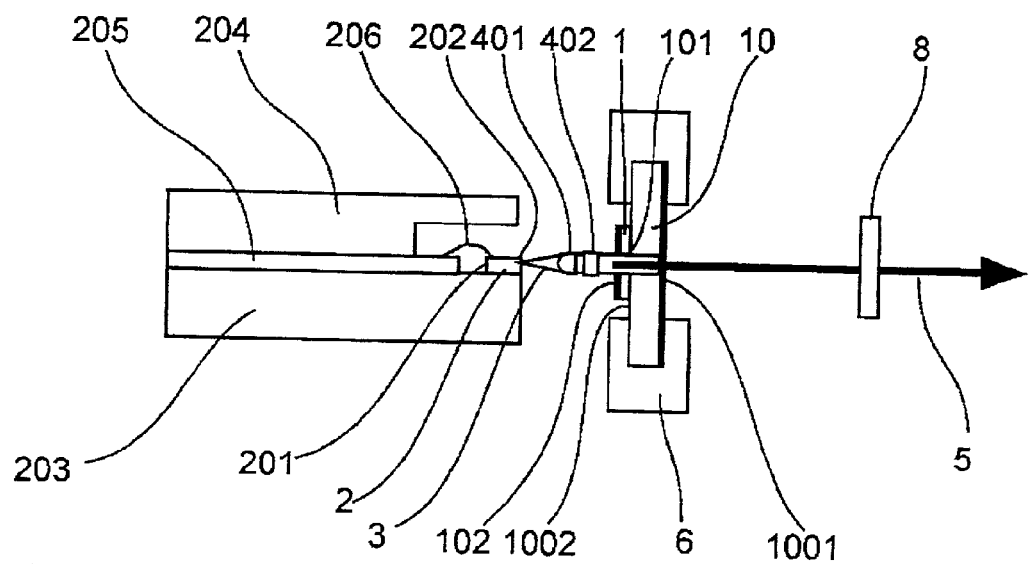
FIG. 14 is a front view showing a structure of an exciting portion of a solid state laser device according to an embodiment 10 of the present invention when viewed from the optical axis direction of the solid state laser element.

FIG. 14 is a front view showing a structure of an exciting portion of a solid state laser device according to an embodiment 10 of the present invention when viewed from the optical axis direction of the solid state laser element. In the solid state laser device of the present embodiment, the Yb-doped circular-disk YAG crystal is employed as the solid state laser element 1, and also the semiconductor laser array 2 that contains InGaAs as the principal component and has the oscillation wavelength 940 nm is employed as the excitation light source. In FIG. 14, 10 is a substrate made of the undoped YAG crystal whose active medium is not doped, and the solid state laser element 1 is fixed onto an end face 1001 of the substrate 10, that opposes to the semiconductor laser array 2, via the optical contact. The heat sink 6 consisting of the water-cooled block is arranged around the substrate 10 to cool the solid state laser element 1 via the substrate 10.

In the solid state laser device of the present embodiment, the two-wavelength coating that exhibits the low reflection to 1030 nm which is the wavelength of the solid state laser light and exhibits the high reflection to 940 nm which is the oscillation wavelength of the semiconductor laser array 2 is applied to the end face 1001 of the substrate 10, that is positioned on the opposite side to the semiconductor laser array 2, and the high reflection coating to the oscillation wavelength 940 nm of the semiconductor laser array 2 is applied to the end face 201 of the semiconductor laser array 2. Thus, the first optical resonator is constructed the end face 1001 of the substrate 10 and the end face 201 of the semiconductor laser array 2. Also, the optical elements 401, 402 that can adjust the mode patterns of the excitation light 3 in the directions perpendicular to and parallel with the active layer of the semiconductor laser array 2 respectively are inserted into the first optical resonator.

Also, the two-wavelength coating that exhibits the high reflection to the wavelength 1030 nm of the solid state laser light and exhibits the low reflection to the oscillation wavelength 940 nm of the semiconductor laser array 2 is applied to the end face 102 of the solid state laser element 1 positioned on the opposite side to the semiconductor laser array 2. The two-wavelength coated end face 102 of the solid state laser element 1 and the partial reflection mirror 8, that is positioned on the outside of the solid state laser element 1 to the wavelength 1030 nm of the solid state laser light, constitute the second optical resonator to the solid state laser light 5.

In this case, the end face 101 of the solid state laser element 1 positioned on the opposite side to the semiconductor laser array 2 and the end face 1002 of the substrate 10 positioned on the side opposing to the semiconductor laser array 2 are finished merely by the optical polishing, but the reflection preventing coating, or the like is not applied. Since both the solid state laser element 1 and the substrate 10 employ the YAG crystal as the base material, there is no difference in the refraction index between them. Thus, the reflection loss is scarcely generated at the boundary between the solid state laser element 1 and the substrate 10.

In the solid state laser device of the present embodiment, since the solid state laser element 1 is arranged in the first optical resonator, it is possible to irradiate the excitation light to the solid state laser element 1 at the high intensity, like the above embodiments. Therefore, even if the three-level solid state laser element is employed, the laser oscillation can be obtained effectively.

In addition, there is the advantage such that, since the optical axis direction of the solid state laser light 5 is set in parallel with the optical axis direction of the excitation laser, alignment/adjustment of the first and second optical resonators to the excitation laser and the solid state laser element 1 can be facilitated.

Also, as described above, if the solid state laser element 1 is optically excited, the heat generation in the solid state laser element 1 is inevitable. In the solid state laser device of the present embodiment, the solid state laser element 1 is cooled by the thermal conduction from the large-area end face 101 of the circular-disk solid state laser element 1 via the substrate 10. As a result, the temperature gradient is generated in the direction from the end face 102 of the solid state laser element 1 to the end face 101, i.e., along the thickness direction of the solid state laser element 1. Also, the refraction index of the solid state laser element 1 is also changed in response to the temperature distribution in the solid state laser element 1.

In the solid state laser device of the present embodiment, the thickness direction of the solid state laser element 1 and the optical axis direction of the solid state laser light 5 are set in parallel with each other. Therefore, the influence of the refraction index distribution generated in the solid state laser element 1 upon the optical characteristics of the solid state laser light 5 is small, and thus the almost constant beam beam quality can be stably maintained irrespective of the input energy into the solid state laser element 1.

Also, the excitation light irradiating region in the solid state laser element 1 can be changed arbitrarily by changing the optical characteristics and the alignment position of the optical elements 401, 402 arranged in the optical resonator for the excitation light 3. In the solid state laser device of the present embodiment, since the optical axis direction of the solid state laser light 5 is constructed in parallel with the optical axis direction of the excitation laser, the mode selection of the solid state laser light 5 can be simply carried out by selecting the excitation light irradiating region. Accordingly, the solid state laser light 5 which is excellent in the beam quality can be generated effectively.

(Embodiment 11)

Figure 15:
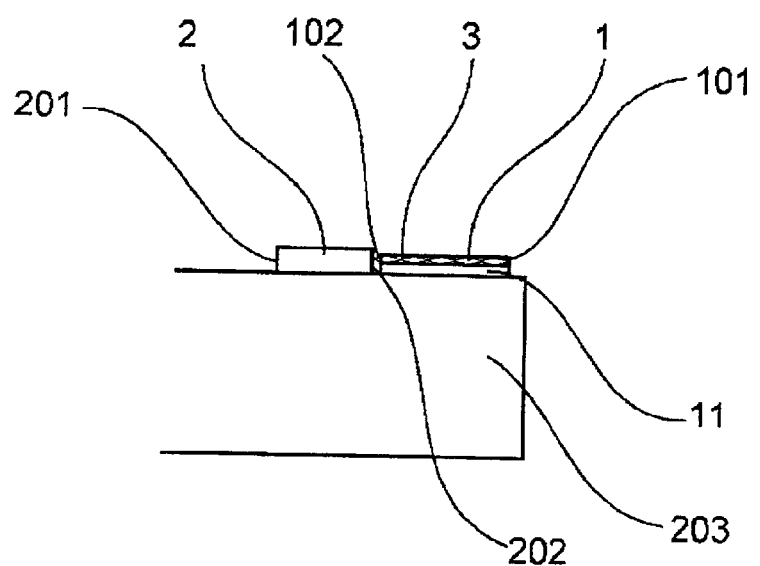
FIG. 15 is a front view showing a structure of an exciting portion of a solid state laser device according to an embodiment 11 of the present invention when viewed from the optical axis direction of the solid state laser element.

FIG. 15 is a front view showing a structure of an exciting portion of a solid state laser device according to an embodiment 11 of the present invention when viewed from the optical axis direction of the solid state laser element 1. In the solid state laser device of the present embodiment, the Nd-doped YAG crystal which is very thin like a thickness 5 $\mu$m is employed as the solid state laser element 1. Also, the semiconductor laser array 2 containing AlGaAs as the principal component is employed as the excitation laser. In FIG. 15, 11 is a substrate made of sapphire, and the solid state laser element 1 is deposited and formed on the substrate 11.

The solid state laser element 1 formed on the substrate 11 is fixed onto the heat sink 203, that is used commonly by the semiconductor laser array 2, in very close vicinity of the semiconductor laser array 2 to have an interval of less than 5 $\mu$m to the semiconductor laser array 2. The high reflection coating to the oscillation wavelength 808 nm of the semiconductor laser array 2 is applied to the side 101 of the solid state laser element 1 positioned on the opposite side to the semiconductor laser array 2. Thus, the first optical resonator consists of the side 101 of the solid state laser element 1 and the end face 201 the semiconductor laser array 2. Also, the low reflection coating to the oscillation wavelength 808 nm of the semiconductor laser array 2 is applied to the side 102 of the solid state laser element 1, that opposes to the semiconductor laser array 2, and the end face 202 of the semiconductor laser array 2 respectively.

In the solid state laser device of the present embodiment, the layer thickness of the solid state laser element 1 is constructed very thin such as about 5 $\mu$m thick. Also, since the refractive index of the substrate 11 is small rather than the refractive index of the solid state laser element 1, the substrate 11 functions as the cladding layer of the solid state laser element 1. As a result, the excitation light 3 is confined effectively in the solid state laser element 1 and waveguide-propagates through the solid state laser element 1. Meanwhile, the excitation light 3 also waveguide-propagates through the semiconductor laser array 2, and only the guided mode that is matched with the guided mode in the solid state laser element 1 and the guided mode in the semiconductor laser array 2 is selected to cause the laser oscillation in the first optical resonator. Since the solid state laser element 1 is arranged in vicinity of the semiconductor laser array 2, the coupling rate between the guided mode in the solid state laser element 1 and the guided mode in the semiconductor laser array 2 is very high. Therefore, even if the thickness of the solid state laser element 1 is very small as in the solid state laser device of the present embodiment, the effective excitation can be attained. As the layer thickness of the solid state laser element 1 that can achieve such advantage, the thickness in the range of 3 to 100 $\mu$m is preferable.

Out of two end faces of the solid state laser element 1 along the optical axis, one end face is subjected to the high reflection coating to the wavelength 1064 nm of the solid state laser light and the other end face is subjected to the partial reflection coating to the wavelength 1064 nm of the solid state laser light. Both end faces constitute the second optical resonator to the solid state laser light. Like the excitation light 3, the solid state laser light waveguide-propagates in the second optical resonator to cause the laser oscillation. As a result, the solid state laser light that has the beam beam quality close to the theoretical limit in the waveguide direction can be generated effectively.

The waveguide laser is expected as the active integrated optical device in the prior art, nevertheless the practical laser device has not been implemented yet since it is difficult to effectively excite such waveguide laser. However, according to the solid state laser device of the present embodiment, the solid state laser element 1 serving as the waveguide is arranged in the first optical resonator of the excitation laser, and also the guided mode of the excitation light 3 in the solid state laser element 1 is coupled with the guided mode in the semiconductor laser array 2. Therefore, the optical loss to the excitation light 3 in the first optical resonator is small, and thus the excitation light 3 can be irradiated at the high intensity to cause effectively the excitation even if the solid state laser element 1 is very thin.

In the solid state laser device of the present embodiment, since both the solid state laser element 1 and the semiconductor laser array 2 are cooled simultaneously by using the common heat sink 203, not only the considerable reduction in size of the solid state laser device can be achieved but also the number of parts constituting the solid state laser device can be reduced, and thus the reduction in the production cost can be achieved. In addition, the alignment precision of the solid state laser element 1 to the semiconductor laser array 2 can be improved, and also the solid state laser device is strong against the mechanical disturbance such as the vibration, etc., so that the stable solid state laser light can always be output effectively.

(Embodiment 12)

Figure 16:
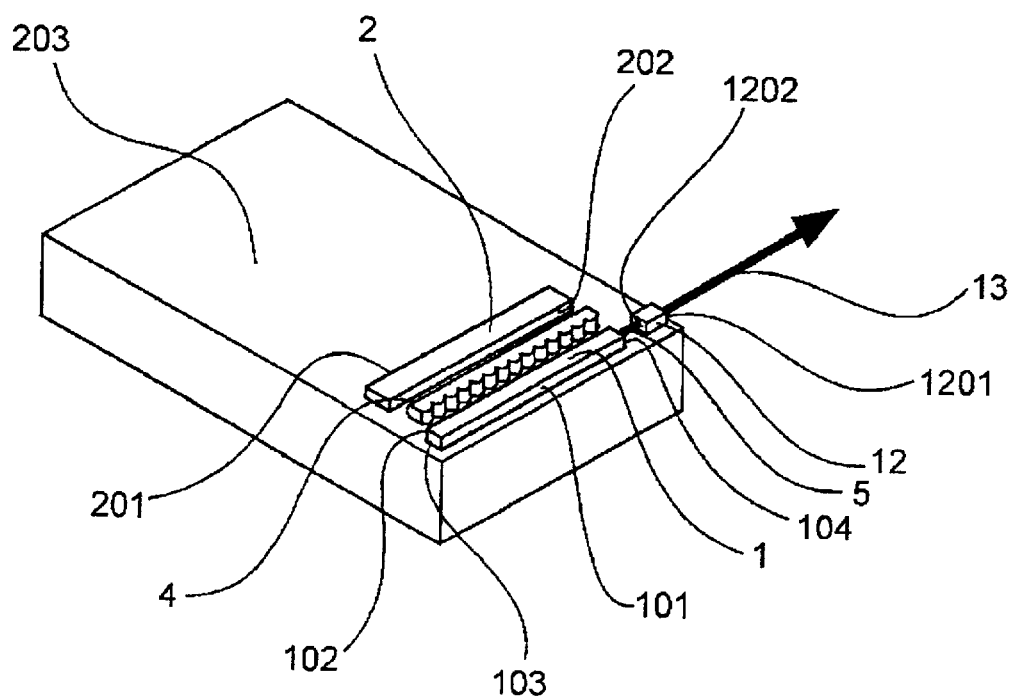
FIG. 16 is a perspective view showing a structure of an exciting portion of a solid state laser device according to an embodiment 12 of the present invention.

FIG. 16 is a perspective view showing a structure of an exciting portion of a solid state laser device according to an embodiment 12 of the present invention. In the solid state laser device of the present embodiment, the Yb-doped YAG crystal is employed as the solid state laser element 1, and the semiconductor laser array 2 that contains InGaAs as the principal component and has the oscillation wavelength of 940 nm is employed as the excitation light source. In FIG. 16, 12 is a wavelength-converting crystal made of KTP (Kalium Titanium Phosphate), which is formed to attain the Type-II phase matching in the harmonic generation at the wavelength 1030 nm. 13 is a laser light having the wavelength 510 nm, which is a second harmonic of the solid state laser light having the wavelength 1030 nm.

In the solid state laser device of the present embodiment, the first optical resonator is constructed by applying the high reflection coating to the oscillation wavelength 940 nm of the semiconductor laser array 2 to the side 101 of the solid state laser element 1 and the end face 201 of the semiconductor laser array 2 respectively. Also, the mode pattern of the excitation light 3 is adjusted by inserting the optical element shown in the embodiment 4 (FIG. 8) into the first optical resonator. In this case, the low reflection coating to the oscillation wavelength 940 nm of the semiconductor laser array 2 is applied to the side 102 of the solid state laser element 1 and the end face 202 of the semiconductor laser array 2 respectively. In addition, all the solid state laser element 1, the semiconductor laser array 2, the optical element 4 for adjusting the mode pattern of the excitation light, and the wavelength-converting crystal 12 are fixed to the same heat sink 203.

The two-wavelength coating that exhibits the high reflection to the wavelength 1030 of the solid state laser light and exhibits the low reflection to the wavelength 515 of the second harmonic is applied to an end face 1201 of the wavelength-converting crystal 12 arranged on the opposite side to the solid state laser element 1. The high reflection coating to the wavelength 1030 of the solid state laser light is applied to the end face 103 of the solid state laser element 1. The second optical resonator is constructed by the end face 1201 of the wavelength-converting crystal 12 and the end face 103 of the solid state laser element 1. The two-wavelength coating that exhibits the low reflection to the wavelength 1030 of the solid state laser light and exhibits the high reflection to the wavelength 515 of the second harmonic is applied to an end face 1202 of the wavelength-converting crystal 12 arranged on the opposite side to the solid state laser element 1. In addition, the low reflection coating to the wavelength 1030 of the solid state laser light is applied to the end face 104 of the solid state laser element 1.

Next, an operation will be explained hereunder. The solid state laser element 1 is arranged in the first optical resonator and is excited effectively by the excitation light at the high intensity. Thus, the population inversion is formed in the solid state laser element 1. A part of the spontaneous emission light generated in the solid state laser element 1 is confined in the second optical resonator that is constructed between the end face 103 of the solid state laser element 1 and the end face 1201 of the wavelength-converting crystal 12, and travels back and forth in the second optical resonator. When the spontaneous emission light passes through the population inversion, such spontaneous emission light is subjected to the amplifying action by the stimulated emission, and thus the light intensity in the second optical resonator is quickly increased and the laser oscillation is started. When the solid state laser light 5 of the wavelength 1030 nm passes through the wavelength-converting crystal 12 in the second optical resonator, a part of the solid state laser light 5 is converted into the second harmonic by the nonlinear optical effect and extracted to the outside of the second optical resonator. Also, the second harmonic generated when the solid state laser light, which travels from the end face 1201 of the wavelength-converting crystal 12 to the side 103 of the solid state laser element 1, passes through the wavelength-converting crystal 12 is also subjected to the reflecting action by the end face 1202 of the wavelength converting crystal 12 to change its traveling direction oppositely, and then extracted to the outside of the second optical resonator.

The converting efficiency into the second harmonic by the wavelength-converting crystal 12 is theoretically in proportion to square of the excitation light intensity. In the solid state laser device of the present embodiment, since the solid state laser element 1 is arranged in the first optical resonator and is excited, the excited region is limited to the inside of the mode of the excitation light and thus the very high gain density can be obtained. Further, since the solid state laser light is confined in the second optical resonator, the intensity of the solid state laser light in the second optical resonator is extremely increased. As a result, the second harmonic can be generated extremely effectively with such compact structure.

Also, in the solid state laser device of the present embodiment, since the solid state laser element 1 and the wavelength-converting crystal 12 are fixed onto the same heat sink 203, not only further reduction in size of the solid state laser device to generate the second harmonic can be achieved but also the solid state laser device is strong against the mechanical disturbance such as the vibration, etc., so that the second harmonic can always be stably generated.

In addition, in the solid state laser device of the present embodiment, the wavelength-converting crystal 12 is also used as one of a pair of mirrors in the second optical resonator to the solid state laser light 5. Therefore, not only the number of parts can be reduced and the production cost becomes inexpensive, but also further miniaturization of the solid state laser device to generate the second harmonic can be accomplished and also assembling/adjustment can be facilitated.

Furthermore, since the wavelength-converting crystal 12 is also used as one of a pair of mirrors in the second optical resonator to the solid state laser light 5, the optical axis of the solid state laser light 5 is defined by the wavelength-converting crystal 12. Therefore, the solid state laser light 5 is always incident to the wavelength-converting crystal 12 at a constant angle. As a result, the stable wavelength-converting efficiency can be always maintained.

In the solid state laser device of the present embodiment, the structure in which KTP is employed as the wavelength-converting crystal is shown. The wavelength converting crystal is not limited to this. The appropriate material for the wavelength-converting crystal may be selected according to the employed solid state laser element and a desired wavelength.

(Embodiment 13)

Figure 17:
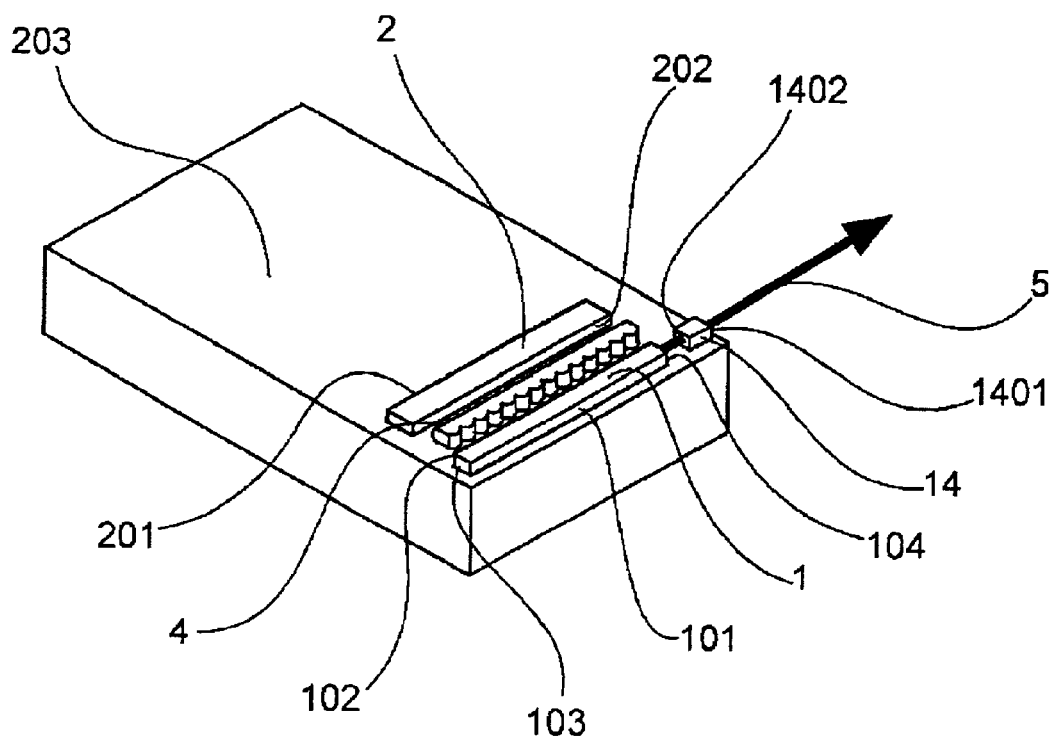
FIG. 17 is a perspective view showing a structure of an exciting portion of a solid state laser device according to an embodiment 13 of the present invention.

FIG. 17 is a perspective view showing a structure of an exciting portion of a solid state laser device according to an embodiment 13 of the present invention. In the solid state laser device of the present embodiment, the Nd-doped YAG crystal is employed as the solid state laser element 1, and the semiconductor laser array 2 that contains AlGaAs as the principal component and has the oscillation wavelength 808 nm is employed as the excitation light source. In FIG. 17, 14 is a passive Q switching element formed of the Cr (Chromium)-doped YAG crystal, that exhibits the saturable absorption characteristic to the light intensity of the laser light passing through this passive Q switching element.

In the solid state laser device of the present embodiment, the first optical resonator is constructed by applying the high reflection coating to the oscillation wavelength 808 nm of the semiconductor laser array 2 to the end face 101 of the solid state laser element 1 and the end face 201 of the semiconductor laser array 2 respectively. Also, like the above embodiment 11, the mode pattern of the excitation light is adjusted by inserting the optical element 4 shown in the embodiment 4 (FIG. 8) into the first optical resonator. The low reflection coating to the oscillation wavelength 808 nm of the semiconductor laser array 2 is applied to the side 102 of the solid state laser element 1 and the end face 202 of the semiconductor laser array 2 respectively. In addition, all the solid state laser element 1, the semiconductor laser array 2, the optical element 4 for adjusting the mode pattern of the excitation light, and the passive Q switching element 14 are fixed to the same heat sink 203.

The partial reflection coating to the wavelength 1064 nm of the solid state laser light is applied to an end face 1401 of the passive Q switching element 14 arranged on the opposite side to the solid state laser element 1. The high reflection coating to the wavelength 1064 nm of the solid state laser light is applied to the end face 103 of the solid state laser element 1. The second optical resonator is constructed by the end face 1401 of the passive Q switching element 14 and the end face 103 of the solid state laser element 1. Also, the low reflection coating to the wavelength 1064 nm of the solid state laser light is applied to an end face 1402 of the passive Q switching element 14, that opposes to the solid state laser element 1, and the end face 104 of the solid state laser element 1 respectively.

Next, an operation will be explained hereunder. The solid state laser element 1 is arranged in the first optical resonator and is excited effectively by the excitation light at the high intensity, and thus the population inversion is formed in the solid state laser element 1. Since the Cr-doped YAG crystal employed as the passive Q switching element 14 has the absorption at the ground level, the rapid increase of the light intensity in the second optical resonator can be suppressed.

As a result, the reduction in the population inversion generated by the stimulated emission can be suppressed, the high energy is accumulated in the upper level of the solid state laser element 1. The very high gain is formed in the solid state laser element 1 with the energy accumulation in the upper level, and the light intensity in the second optical resonator is gradually increased. A light quantity absorbed by the passive Q switching element 14 is increased with the increase of the light intensity, and thus the ground level number in the passive Q switching element 14 is gradually reduced. An absorption rate is reduced quickly with the reduction in the ground level number in the passive Q switching element 14, and the energy accumulated in the solid state laser element 1 as the population inversion is discharged at a time as the sharp pulse laser light 5. Since the population inversion in the solid state laser element 1 is quickly reduced by the generation of the pulse laser light 5 and also the light intensity in the second optical resonator is reduced, the ground level number in the passive Q switching element 14 is increased and the high absorption rate is recovered again. The sharp pulse laser light is generated repetitively by repeating such process. Since the optical loss due to the absorption is changed by the light intensity in the second optical resonator and the pulse laser light is generated, such oscillation mode is called the passive Q switch.

A pulse time width of the laser light generated by the passive Q switching operation becomes shorter as the gain in the solid state laser element 1 becomes higher, and also is proportional to the resonator length of the second optical resonator. In the solid state laser device of the present embodiment, since the solid state laser element 1 is arranged in the first optical resonator, the excited region in the solid state laser element 1 is limited to the inside of the mode of the excitation light and thus the very high gain density can be obtained. In addition, in the solid state laser device of the present embodiment, since the solid state laser element 1 and the passive Q switching element 14 are fixed onto the same heat sink 203 and the passive Q switching element 14 is used commonly as one of a pair of mirrors in the second optical resonator, the resonator length of the second optical resonator can be constructed shorter much more. As a result, this compact structure makes it possible to generate the sharp pulse laser light whose pulse time width is short and whose peak intensity is high.

Also, the repetitive frequency of the passive Q switching operation is increased as the gain of the solid state laser element 1 is enhanced. According to the solid state laser device of the present embodiment, since it is possible to form the high gain density in the solid state laser element 1, the sharp pulse laser light can be generated by the very highly repeating action.

In addition, in the solid state laser device of the present embodiment, since the solid state laser element 1 and the passive Q switching element 14 are fixed onto the same heat sink 203, not only the passive Q switching operation can be executed with the very compact structure but also the solid state laser device is strong against the mechanical disturbance such as the vibration, etc., whereby the pulse laser light can always be generated stably.

Besides, in the solid state laser device of the present embodiment, since the passive Q switching element 14 is also used as one of a pair of mirrors in the second optical mirror, the number of parts constituting the solid state laser device can be reduced. Thus, not only the assembling/adjustment can be facilitated but also the reduction in the production cost can be achieved.

(Embodiment 14)

Figure 18:
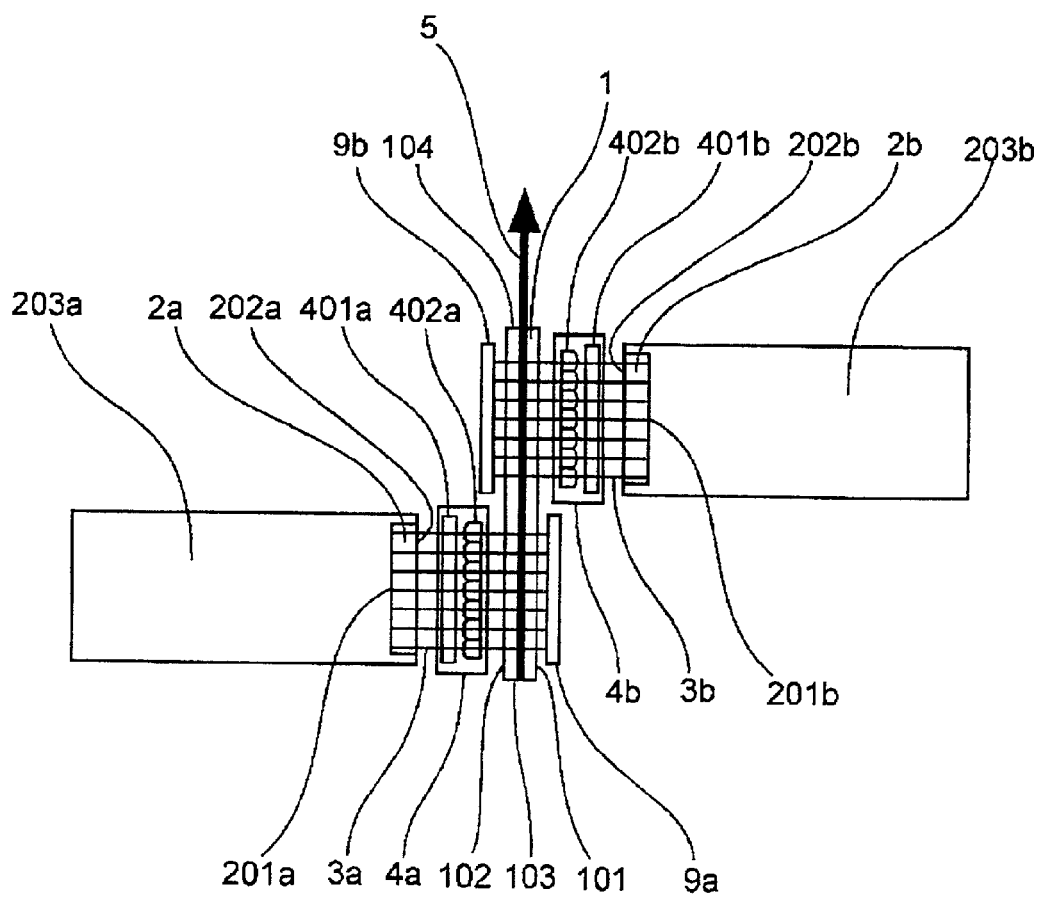
FIG. 18 is a top view showing a structure of an exciting portion of a solid state laser device according to an embodiment 14 of the present invention.

FIG. 18 is a top view showing a structure of an exciting portion of a solid state laser device according to an embodiment 14 of the present invention. In the solid state laser device of the present embodiment, two semiconductor laser arrays 2a, 2b serving as the excitation laser are arranged along the optical axis of the solid state laser element 1 with respect to one solid state laser element 1 such that the optical axes of the excitation lasers intersect orthogonally with the optical axis of the solid state laser element 1. Also, two semiconductor laser arrays 2a, 2b are arranged to put the solid state laser element 1 between them and directed mutually oppositely.

In the solid state laser device of the present embodiment, the first optical resonator for a first semiconductor laser array 2a as a first excitation laser is constructed between a high reflection mirror 9a and an end face 201a of the first semiconductor laser array 2a, to which the high reflection coating to the wavelength of the excitation light is applied respectively. The first optical resonator for a second semiconductor laser array 2b as a second excitation laser is constructed between a high reflection mirror 9b and an end face 201b of the second semiconductor laser array 2b, to which the high reflection coating to the wavelength of the excitation light is applied respectively. Also, the low reflection coating to the wavelength of the excitation light is applied to the end faces 202a, 202b of the first and second semiconductor laser arrays 2a, 2b and the sides 101, 102 of the solid state laser element 1 respectively. Optical elements 401a, 402a and 401b, 402b for adjusting the mode pattern of the excitation light are inserted into both first optical resonators of the first and second semiconductor laser arrays 2a, 2b respectively.

As shown in the solid state laser device of the present embodiment, if the first optical resonator consisting of a plurality of excitation lasers is arranged to one solid state laser element, the higher output of the solid state laser light 5 can be achieved effectively.

Also, in the solid state laser device of the present embodiment, the optical axis direction of the excitation lasers 201a, 201b is arranged to intersect orthogonally with the optical axis direction of the solid state laser element 1. Therefore, if the first optical resonator is further provided along the optical axis of the solid state laser element 1, the higher output of the solid state laser light 5 can be achieved effectively with the simple structure.

In the structure in which the first optical resonator consisting of a plurality of excitation lasers is arranged along the optical axis of the solid state laser element 1 to increase the output, even if the number of the excitation lasers is increased, the excitation density in the solid state laser element 1 is maintained constant. Therefore, thermal load in the solid state laser element 1 can be maintained constant, the degradation of the beam quality of the solid state laser light 5 because of the higher output can be suppressed, and the thermal breakdown of the solid state laser element 1 can be prevented.

Also, as shown in the solid state laser device of the present embodiment, in the structure in which the first optical resonator consisting of a plurality of excitation lasers is arranged along the optical axis of the solid state laser element 1, if the alignment directions of the excitation lasers are arranged to put the solid state laser element 1 between them and to direct mutually oppositely, the influence of the excitation density gradient on the optical axes of the excitation lasers in the solid state laser element 1 can be compensated, and the solid state laser light 5 which is excellent in the beam quality can be generated stably.

In the solid state laser device of the present embodiment, the structure in which two semiconductor laser arrays 201a, 201b are arranged along the optical axis of the solid state laser element 1 is shown. But the number of the excitation lasers arranged to the solid state laser element 1 is not limited to this. That is, the number of the excitation lasers may be selected in response to the desired output.

Also, in the solid state laser device of the present embodiment, the structure in which a plurality of excitation lasers are arranged along the optical axis of the solid state laser element 1 to direct mutually oppositely is shown. If a plurality of excitation lasers are arranged totally in the same direction as the solid state laser element 1, not only the higher output can be achieved effectively but also alignment/adjustment of the excitation lasers can be facilitated and also the structure of the overall solid state laser device can be simplified.

(Embodiment 15)

Figure 19:
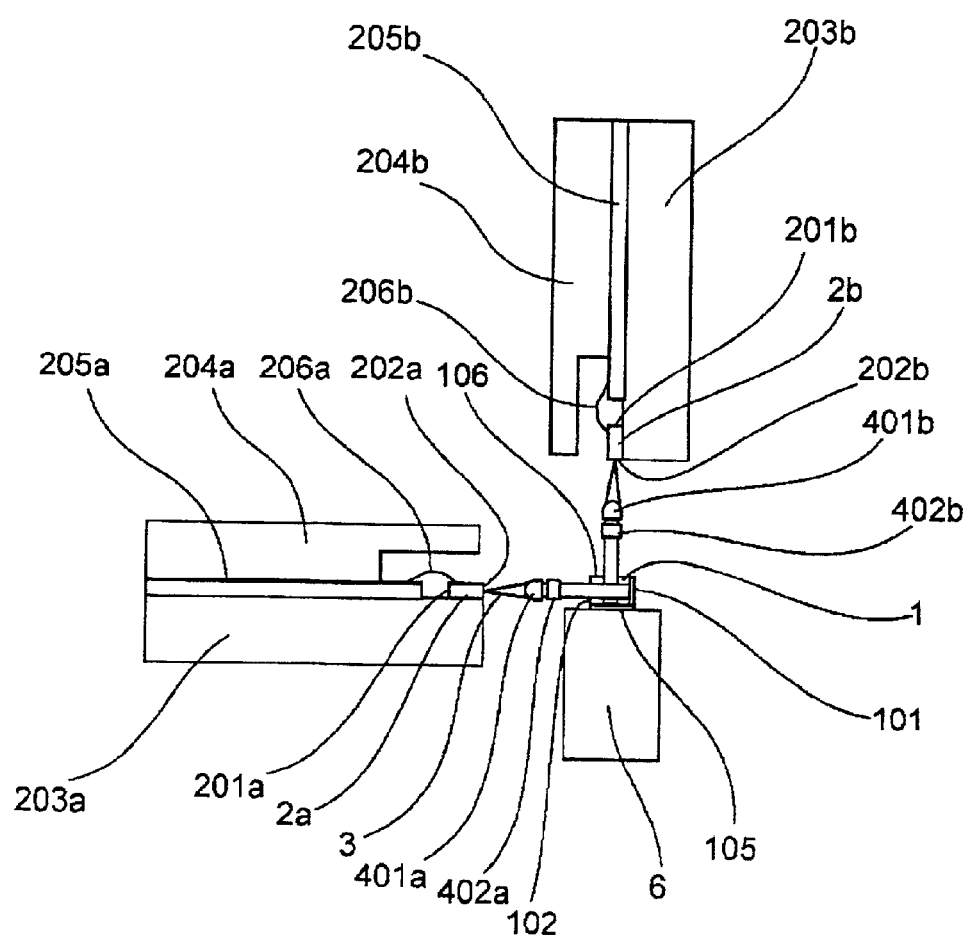
FIG. 19 is a front view showing a structure of an exciting portion of a solid state laser device according to an embodiment 15 of the present invention when viewed from the optical axis direction of the solid state laser element.

FIG. 19 is a front view showing a structure of an exciting portion of a solid state laser device according to an embodiment 15 of the present invention when viewed from the optical axis direction of the solid state laser element 1. In the solid state laser device of the present embodiment, two semiconductor laser arrays 2a, 2b are arranged to one solid state laser element 1 such that their optical axes intersect orthogonally with each other. The first optical resonator to the first semiconductor laser array 2a as the first excitation laser is constructed between the side 101 of the solid state laser element 1 and the end face 201a of the first semiconductor laser array 2a, to which the high reflection coating to the wavelength of the excitation light is applied respectively. Also, the first optical resonator to the second semiconductor laser array 2b as the second excitation laser is constructed between a bottom face 105 of the solid state laser element 1 and the end face 201b of the second semiconductor laser array 2b, to which the high reflection coating to the wavelength of the excitation light is applied respectively. In addition, the low reflection coating to the wavelength of the excitation light is applied to the end faces 202a, 202b of the first and second semiconductor laser arrays 2a, 2b and the side 102 and the upper face 106 of the solid state laser element 1. The mode pattern of the excitation light is adjusted by inserting the optical elements 401a, 402a and 401b, 402b into both first optical resonators to the first and second semiconductor laser arrays 2a, 2b respectively.

As shown in the solid state laser device of the present embodiment, if the first optical resonators for a plurality of excitation lasers that have different optical axis angles with respect to one solid state laser element 1 are arranged to surround the solid state laser element 1 therein and to excite the solid state laser element 1, the output of the solid state laser light can be increased effectively. Also, if a plurality of excitation lasers having the optical axes with different angles are employed, the higher output can be attained while keeping the size of the solid state laser element 1 constant. Therefore, the solid state laser light of high optical output can be obtained effectively with the compact structure without the increase of the optical loss in the optical resonator of the solid state laser device.

In addition, if a plurality of excitation lasers having different optical axis angles are arranged to one solid state laser element, the excitation density distribution in the solid state laser element is homogenized and thus the solid state laser light which is excellent in the beam quality can be generated stably.

In the solid state laser device of the present embodiment, there is shown the structure in which two semiconductor laser arrays are arranged to one solid state laser element to cause their optical axes to intersect orthogonally with each other. But the number of the excitation lasers and alignment/angles of the optical axes of the excitation lasers are not limited to this.

(Embodiment 16)

Figure 20:
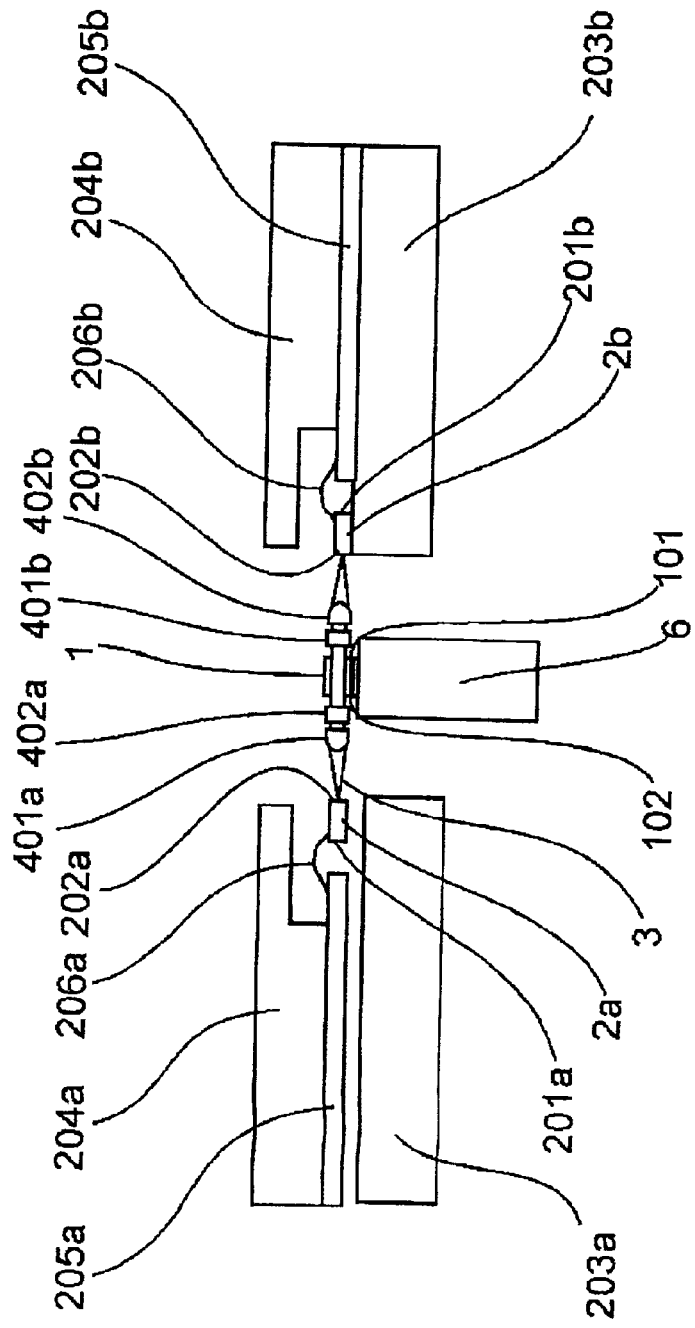
FIG. 20 is a front view showing a structure of an exciting portion of a solid state laser device according to an embodiment 16 of the present invention when viewed from the optical axis direction of the solid state laser element.

FIG. 20 is a front view showing a structure of an exciting portion of a solid state laser device according to an embodiment 16 of the present invention when viewed from the optical axis direction of the solid state laser element. In the solid state laser device of the present embodiment, two semiconductor laser arrays 2a, 2b are arranged on both sides of the solid state laser element 1, and the high reflection coating to the wavelength of the excitation light is applied to the end faces 201a, 201b of two semiconductor laser arrays 2a, 2b respectively, and the first optical resonator is constructed by using two semiconductor laser arrays 2a, 2b. The low reflection coating to the wavelength of the excitation light is applied to the end faces 202a, 202b of two semiconductor laser arrays 2a, 2b and both sides 101, 102 of the solid state laser element 1. Also, the optical elements 401a, 402a and 401b, 402b to adjust the mode pattern of the excitation light are inserted between two semiconductor laser arrays 2a, 2b and the solid state laser element 1 respectively.

As shown in the solid state laser device of the present embodiment, if two semiconductor laser arrays 2a, 2b serving as the amplifying medium to generate the excitation laser light are arranged on both sides of the solid state laser element 1 to oppose mutually and also one first optical resonator is provided to two semiconductor laser arrays 2a, 2b, the excitation light intensity in the first optical resonator can be enhanced more effectively rather than the structure in which the first optical resonator is provided independently to two semiconductor laser arrays respectively. Therefore, the higher output can be achieved more effectively while keeping the number and the size of the solid state laser elements 1 constant.

Also, as shown in the solid state laser device of the present embodiment, if the semiconductor laser arrays are arranged on both sides of the solid state laser element 1 to oppose mutually, the excitation distribution of the excitation light in the solid state laser elements 1 along the optical axis direction becomes symmetric. Therefore, the stability of the first optical resonator to the solid state laser light can be improved remarkably and also the solid state laser light which is excellent in the beam quality and the symmetry can be generated more stably and more easily.

(Embodiment 17)

Figure 21:
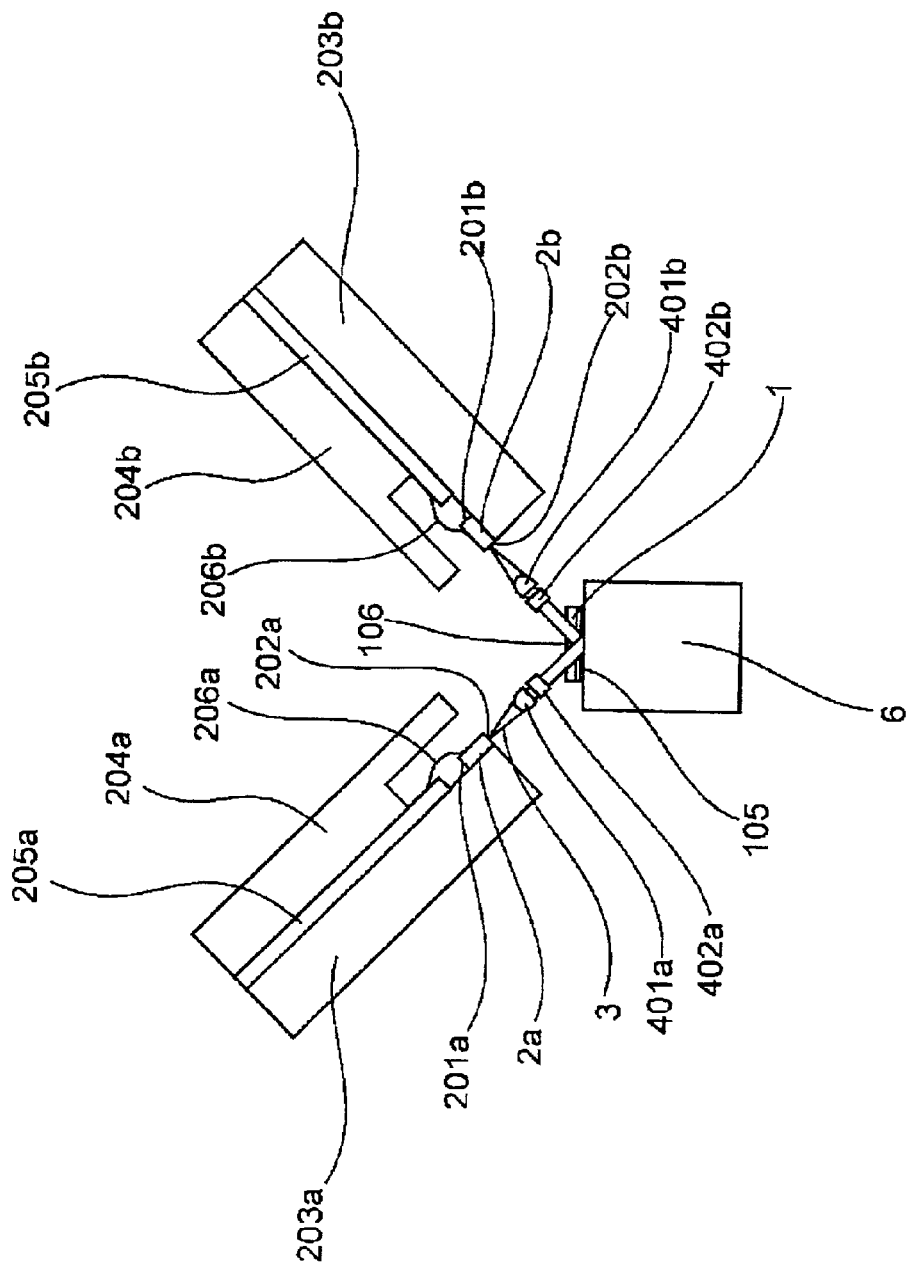
FIG. 21 is a front view showing a structure of an exciting portion of a solid state laser device according to an embodiment 17 of the present invention when viewed from the optical axis direction of the solid state laser element.

FIG. 21 is a front view showing a structure of an exciting portion of a solid state laser device according to an embodiment 17 of the present invention when viewed from the optical axis direction of the solid state laser element. In the solid state laser device of the present embodiment, two semiconductor laser arrays 2a, 2b are arranged such that their optical axes intersect orthogonally with each other. Also, the optical axis of the excitation light 3 is adjusted such that the proceeding direction of the excitation light is folded by the bottom face 105 of the solid state laser element 1, to which the high reflection coating to the wavelength of the excitation light is applied, by 90 degree so as to coincide with the optical axes of the semiconductor laser array 2a and the semiconductor laser array 2b. In the solid state laser device of the present embodiment, the high reflection coating to the wavelength of the excitation light is applied to the end face 201a of the semiconductor laser array 2a and the end face 201b of the semiconductor laser array 2b respectively, and the first optical resonator is constructed by using two semiconductor laser arrays 2a, 2b. Also, the optical elements 401a, 402a and 401b, 402b to adjust the mode pattern of the excitation light are inserted between two semiconductor laser arrays 2a, 2b and the solid state laser element 1 respectively. The low reflection coating to the wavelength of the excitation light is applied to an upper face 106 of the solid state laser element 1.

In the solid state laser device of the present embodiment, since one first optical resonator is provided to the semiconductor laser arrays 2a, 2b as the amplifying mediums to generate the excitation laser light, it is needless to say that the similar advantages to those in the above embodiment 16 can be achieved. Since the optical axes of two semiconductor laser arrays 2a, 2b are arranged to intersect orthogonally mutually, it is possible to limit the excited region in the solid state laser element 1. Thus, not only the solid state laser light 5 can be extracted effectively by exciting the solid state laser element 1 at the higher density, but also the mode selection of the solid state laser light 5 can be carried out by limiting the excited region, so that the generation of the solid state laser light 5 which is excellent in the beam quality can be carried out more effectively.

In the solid state laser device of the present embodiment, there is shown the structure in which respective optical axes of two semiconductor laser arrays 2a, 2b are arranged to intersect orthogonally mutually. However, the angle between the optical axes of two semiconductor laser arrays 2a, 2b is not limited to a right angle, i.e., 90 ?. For example, if the angle between two optical axes is set smaller than 90 ?, the narrower excited region can be limited, and the solid state laser element 1 can be excited at the higher light density, and also the solid state laser light 5 having the excellent beam quality can be output effectively. In contrast, if the angle between two optical axes is set larger than 90 ?, the excited region is enlarged. Therefore, the intensity of the laser light generated from the solid state laser element 1 can be lowered and also the side breakdown, etc. of the solid state laser element 1 can be suppressed, so that the reliability of the solid state laser device can be improved.

Also, in the solid state laser device of the present embodiment, the structure in which the excitation light 3 is reflected only once by the bottom face of the solid state laser element 1 is shown. In this case, if there is employed such a structure that the high reflection coating to the excitation light 3 is applied to a part of the upper face of the solid state laser element 1 to reflect the excitation light 3 plural time in the solid state laser element and then the excitation light 3 is emitted to the outside, the absorption rate of the excitation light in the solid state laser element can be increased and thus the solid state laser element 1 can be excited more effectively.

In this case, in the solid state laser device of the present embodiment, there is shown the structure in which one first optical resonator consisting of two semiconductor laser arrays 201a, 201b is arranged to one solid state laser element 1 to excite the solid state laser element 1. If a plurality of first optical resonators consisting of plural amplifying mediums are provided to one solid state laser element 1, not only the higher output can be attained but also the uniformity of the excitation distribution in the solid state laser element can be improved and thus the solid state laser light 5 having the excellent beam quality can be extracted stably.

(Embodiment 18)

Figure 22:
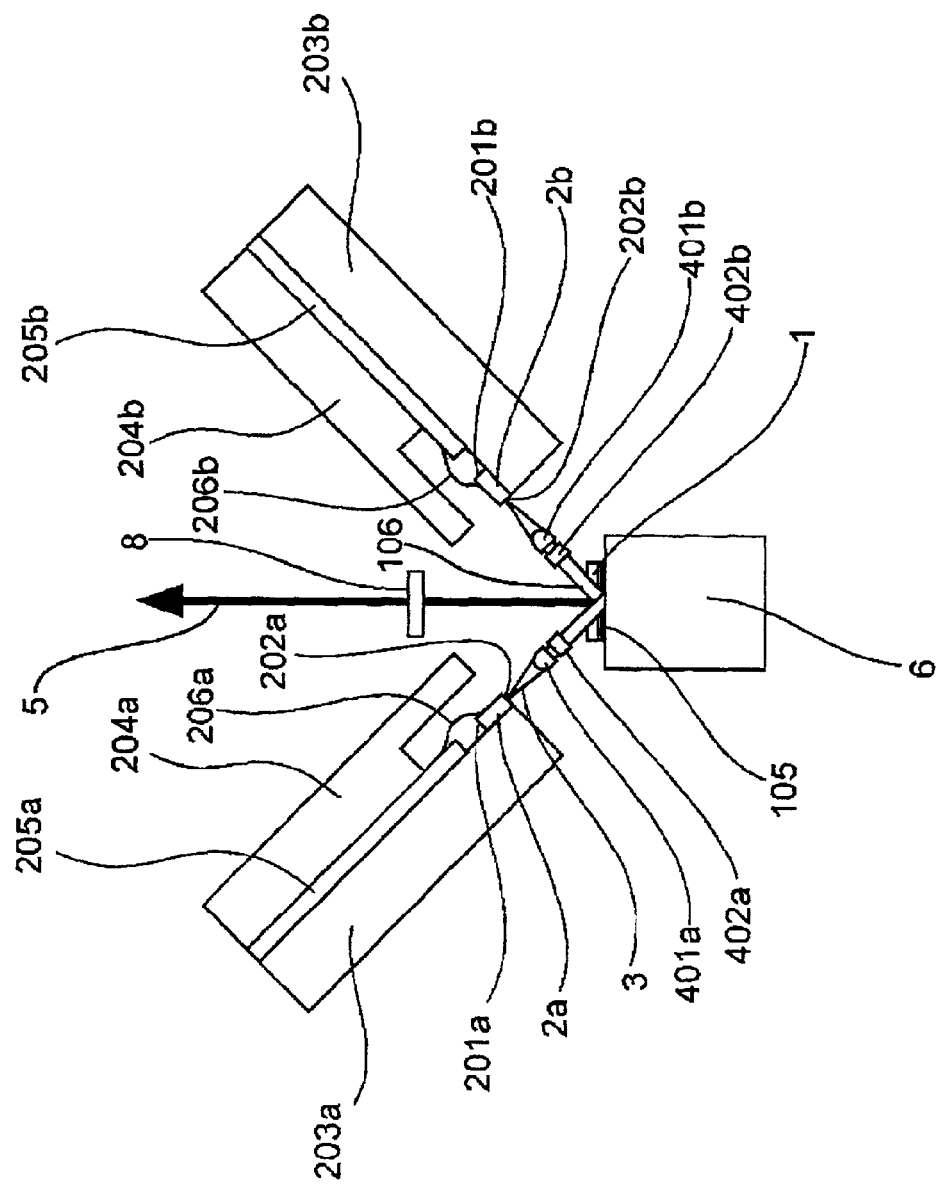
FIG. 22 is a front view showing a structure of an exciting portion of a solid state laser device according to an embodiment 18 of the present invention when viewed from the optical axis direction of the solid state laser element.

FIG. 22 is a front view showing a structure of an exciting portion of a solid state laser device according to an embodiment 18 of the present invention when viewed from the optical axis direction of the solid state laser element. In the solid state laser device of the present embodiment, the thin-plate solid state laser element 1 is fixed onto the heat sink 6. This embodiment 18 is similar to the above embodiment 17 in the alignment of two semiconductor laser arrays 2a, 2b as the amplifying mediums to generate the excitation light 3 and the structure that the solid state laser element 1 is excited by providing one first optical resonator to two semiconductor laser arrays 2a, 2b. In the solid state laser device of the present embodiment, two-wavelength coating that exhibits the low reflectance to the wavelength of the excitation light and the wavelength of the solid state laser light is applied to the upper face 106 of the solid state laser element 1, and also two-wavelength coating that exhibits the high reflectance to the wavelength of the excitation light and the wavelength of the solid state laser light is applied to the bottom face 105 of the solid state laser element 1. Also, the partial reflection mirror to the wavelength of the solid state laser light is provided on the solid state laser element 1, and thus the second optical resonator to the solid state laser light is constructed by the partial reflection mirror and the bottom face 105 of the solid state laser element 1.

In the solid state laser device of the present embodiment, two semiconductor laser arrays 2a, 2b are employed as the amplifying mediums to generate the excitation laser light, and one first optical resonator are provided to two semiconductor laser arrays 2a, 2b to excite the solid state laser element 1, and in addition the optical axes of two semiconductor laser arrays 2a, 2b are arranged to have a predetermined angle. Therefore, the same advantage as the above embodiment 17 can be achieved.

Also, in the solid state laser device of the present embodiment, since the thin-plate solid state laser element 1 is employed and also the solid state laser element 1 is cooled by providing the heat sink 6 on the large-area bottom face 105 of the solid state laser element 1, the temperature distribution is generated mainly in the direction from the bottom face 105 to the upper face 106 of the solid state laser element 1, i.e., the thickness direction of the solid state laser element 1, with the heat generation of the solid state laser element 1. The refractive index is changed in response to the temperature distribution in the solid state laser element 1.

In the solid state laser device of the present embodiment, the thickness direction of the solid state laser element 1 and the optical axis direction of the solid state laser light 5 are set in parallel with each other. Therefore, the influence of the refractive index distribution, that is generated due to the heat generation of the solid state laser element 1, upon the optical characteristic of the solid state laser light 5 is small, and also the almost constant beam beam quality can be maintained stably independently of the input energy into the solid state laser element 1.

(Embodiment 19)

Figure 23:
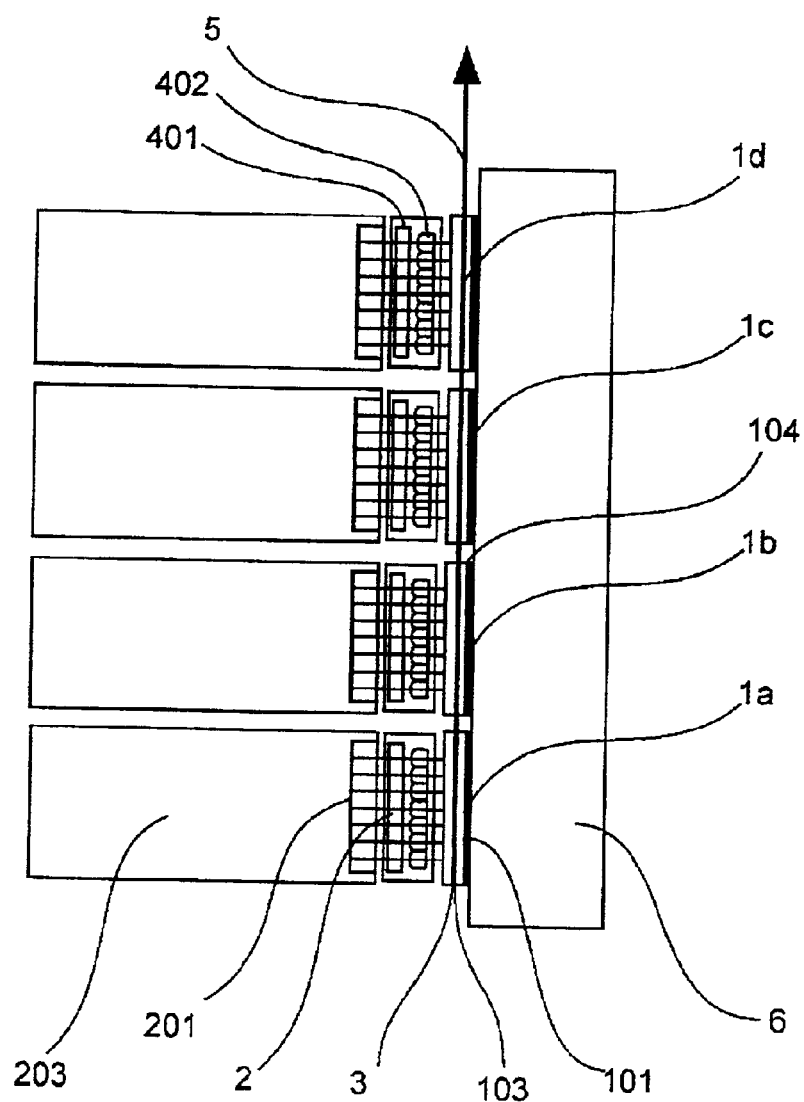
FIG. 23 is a top view showing a structure of an exciting portion of a solid state laser device according to an embodiment 19 of the present invention.

FIG. 23 is a top view showing a structure of an exciting portion of a solid state laser device according to an embodiment 19 of the present invention. In the solid state laser device of the present embodiment, there is shown such a structure that the higher output can be achieved by aligning four solid state laser elements 1a, 1b, 1c, 1d in series along the optical axis. The Yb-doped YAG crystal is employed as the solid state laser elements 1a, 1b, 1c, 1d, and also the semiconductor laser array 2 that contains InGaAs as the principal component and has the oscillation wavelength 940 nm is employed as the excitation laser. The exciting structure for four solid state laser elements 1a, 1b, 1c, 1d is the same, and the first optical resonator is constructed by the side 101 of the solid state laser element and the side 201 of the semiconductor laser array 2. Also, the mode pattern of the excitation light is adjusted by inserting two optical elements 401, 402 into the first optical resonator.

In the solid state laser device of the present embodiment, four solid state laser elements 1a, 1b, 1c, 1d are fixed onto the common heat sink 6. Also, the second optical resonator to the solid state laser light 5 is constructed by the optical-axis direction end face 103 of the first solid state laser element 1a, to which the high reflection coating to the wavelength 1030 nm of the solid state laser light is applied, and the optical-axis direction end face 104 of the second solid state laser element 1b, to which the partial reflection coating to the wavelength 1030 nm of the solid state laser light is applied. The low reflection coating to the wavelength 1030 nm of the solid state laser light is applied to all sides of other solid state laser elements 1c, 1d in the optical axis direction.

In the solid state laser device of the present embodiment, the structure for extracting the solid state laser light is constructed by providing the second optical resonator to the first solid state laser element 1a and the second solid state laser element 1b. Also, the third solid state laser element 1c and the fourth solid state laser element 1d are employed as the amplifiers for amplifying the solid state laser light that is extracted by the solid optical resonator.

As shown in the solid state laser device of the present embodiment, if a plurality of solid state laser elements arranged in the first optical resonator are arranged in series such that their optical axes coincide with each other, the higher output can be attained effectively with the simply structure while maintaining the beam beam quality.

Also, if the solid state laser elements are arranged in the first optical resonator, the excited region is limited within the mode and therefore the high gain can be obtained in the solid state laser elements. As a result, as shown in the solid state laser device of the present embodiment, even though the oscillator is constructed by a part of the solid state laser elements and remainder of solid state laser elements are employed as the amplifiers, the laser light can be effectively extracted from the solid state laser elements.

Also, as shown in the solid state laser device of the present embodiment, the structure in which the second optical resonator is provided to a part of solid state laser elements is less affected by variation in the excitation intensity of respective solid state laser elements rather than the structure in which the second optical resonator is provided to all the solid state laser elements aligned in series, and thus the stability of the second optical resonator can be remarkably improved. Accordingly, the higher output of the solid state laser light can be achieved stably and effectively.

In addition, as shown in the solid state laser device of the present embodiment, if the oscillator is constructed by a part of solid state laser elements and remainder of solid state laser elements are employed as the amplifiers, the intensity of the laser light in the solid state laser elements used as the amplifiers can be reduced rather than the structure in which the second optical resonators are provided to all the solid state laser elements aligned in series and are used as the amplifiers. Therefore, the breakdown, etc. of the solid state laser elements can be prevented and also improvement of the reliability can be attained.

Further, in the solid state laser device of the present embodiment, since four solid state laser elements 1a, 1b, 1c, 1d are fixed onto the same heat sink 5, the structure of the device can be simplified when the higher output of the solid state laser device is intended by arranging a plurality of solid state laser elements in series. In addition, the alignment precision of the optical axis position between respective solid state laser elements can be improved and also the solid state laser device becomes strong against the mechanical disturbance such as the vibration, etc. As a consequence, in the structure that enhances the output power by arranging a plurality of solid state laser elements in series, the stability of the optical output can be widely improved.

In the solid state laser device of the present embodiment, there is shown the structure in which a plurality of solid state laser elements are arranged in series and also one semiconductor laser array is provided in response to respective solid state laser elements, whereby the higher output of the solid state laser light is intended. But the number of the excitation lasers to one solid state laser element is not limited to one. Even if a plurality of excitation lasers are provided to one solid state laser element, not only the higher output can be achieved effectively but only the number of the solid state laser elements required to generate the desired output of the solid state laser light can be reduced. Therefore, there is the advantage such that the assembling/adjustment of the solid state laser device can be facilitated.

(Embodiment 20)

Figure 24:
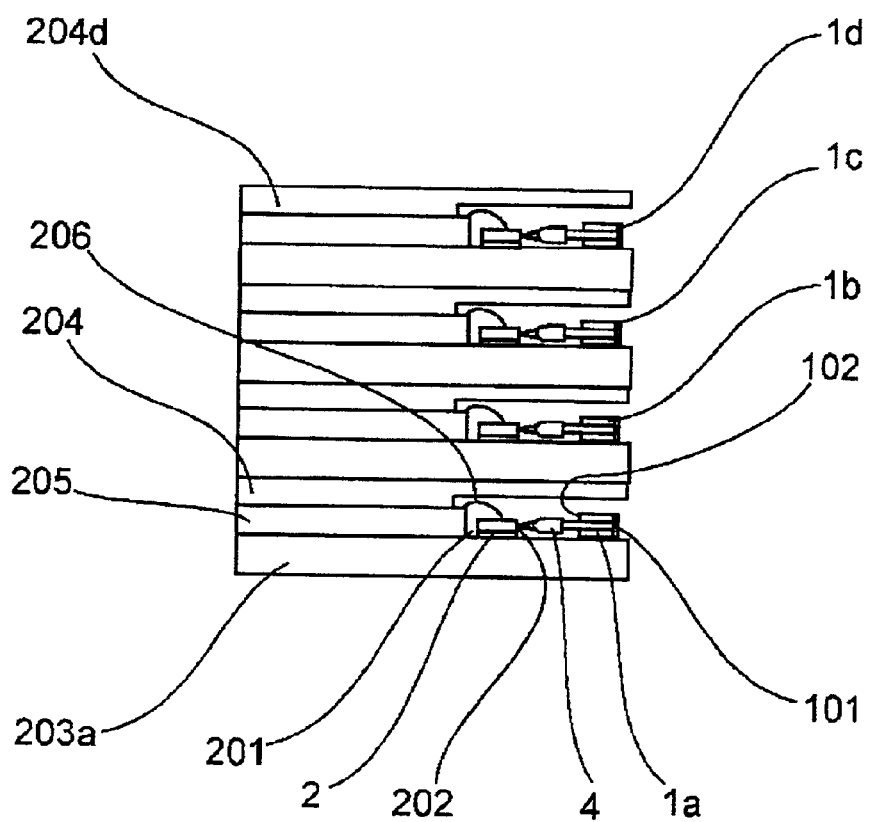
FIG. 24 is a front view showing a structure of an exciting portion of a solid state laser device according to an embodiment 20 of the present invention when viewed from the optical axis direction of the solid state laser element.

FIG. 24 is a front view showing a structure of an exciting portion of a solid state laser device according to an embodiment 20 of the present invention when viewed from the optical axis direction of the solid state laser element. In the solid state laser device of the present embodiment, four solid state laser elements 1a, 1b, 1c, 1d fixed onto the heat sink 203 are stacked in the vertical direction to be arranged in parallel. The exciting structure for respective solid state laser elements 1a, 1b, 1c, 1d are the same respectively, and have the semiconductor laser array 2, the optical element 4 for adjusting the mode pattern of the excitation light, the heat sink 203 also used as the anode, the cathode 204, the insulating plate 205 whose upper and lower faces are matallized, and the metal wire 206 respectively. In the solid state laser device of the present embodiment, since the anode 203 and the cathode 204 both being positioned vertically are stacked in the vertical direction to come electrically into contact with each other, four semiconductor laser arrays 2 corresponding to respective solid state laser elements 1a, 1b, 1c, 1d are mutually connected electrically in series. Accordingly, if the current is injected by applying the voltage between the lowermost anode 203a and the uppermost cathode 204d, all the semiconductor laser arrays 2 can be operated.

Also, in the solid state laser device of the present embodiment, the first optical resonator is constructed by applying the high reflection coating to the wavelength of the excitation light to the sides 101 of the solid state laser elements 1 and the end faces 201 of the semiconductor laser arrays 2. Also, the high reflection coating to the wavelength of the solid state laser light is applied to one end faces of respective solid state laser elements in the optical axis direction, and also the partial reflection coating to the wavelength of the solid state laser light is applied to the other end faces of respective solid state laser elements, whereby the second optical resonator to the solid state laser light is constructed.

In the above embodiment, there is shown the structure in which the higher output can be obtained by arranging a plurality of solid state laser elements. In the structure in which the solid state laser elements are arranged in the first optical resonator, since the excited region in the solid state laser element is limited within the mode of the excitation light, the beam cross section of the solid state laser light is relatively small. Also, the gain formed in the solid state laser element is large, and thus the higher output of the solid state laser light can be effectively accomplished by arranging a plurality of solid state laser elements in series. However, since the beam cross section of the solid state laser light is small and also the light intensity on the sides of the solid state laser elements is increased, the upper limit of the solid state laser light output is restricted by the light resistant strength of the sides of the solid state laser elements.

As shown in the solid state laser device of the present embodiment, if the solid state laser device is constructed by arranging a plurality of solid state laser elements in series to generate the solid state laser light from respective solid state laser elements, the higher output with the high reliability can be achieved easily with the compact structure while maintaining constant the light intensity on the end faces of the solid state laser elements.

Also, as shown in the solid state laser device of the present embodiment, if a plurality of solid state laser elements are stacked in the vertical direction to be arranged in parallel and also the semiconductor laser arrays corresponding to respective solid state laser elements are connected electrically in series, the higher output of the solid state laser light can be effectively achieved with the simple and compact structure.

In the solid state laser device of the present embodiment, there is shown the structure in which the solid state laser elements are arranged in parallel such that the optical axis direction of the excitation laser is arranged to intersect orthogonally with the optical axis direction of the solid state laser element. But the optical axis direction of the excitation laser with respect to the optical axis direction of the solid state laser element is not limited to this. The similar advantages can be obtained by arranging the optical axis of the excitation laser obliquely to or in parallel with the optical axis of the solid state laser element.

Also, if a plurality of solid state laser elements that are arranged in series are arranged in parallel, the higher output can be achieved more effectively.

(Embodiment 21)

Figure 25:
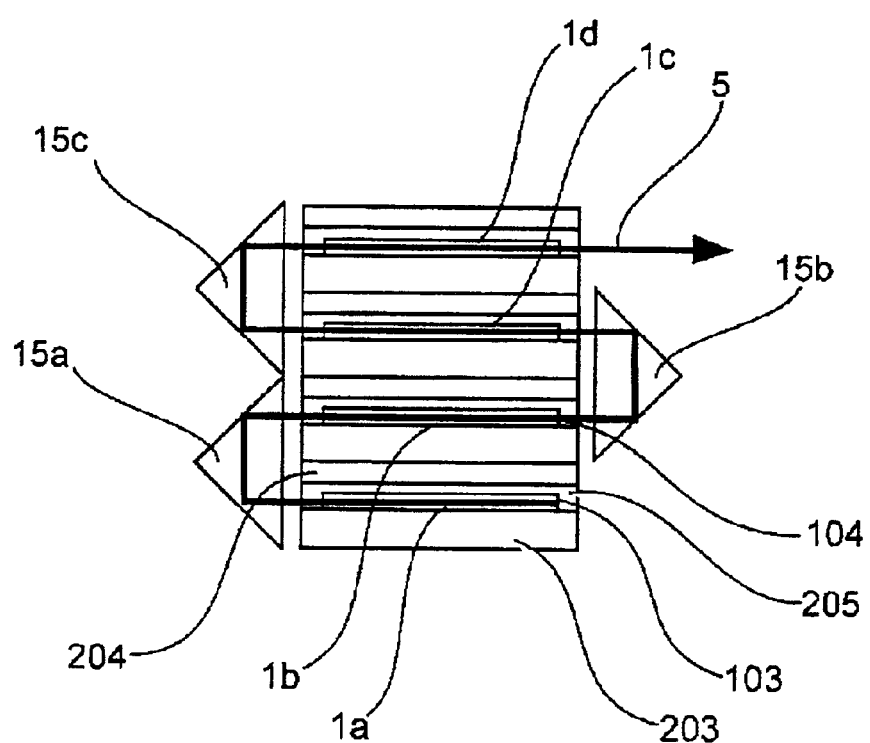
FIG. 25 is a side view showing a structure of an exciting portion of a solid state laser device according to an embodiment 21 of the present invention when viewed from the direction perpendicular to the optical axis of the solid state laser element.
Figure 26:
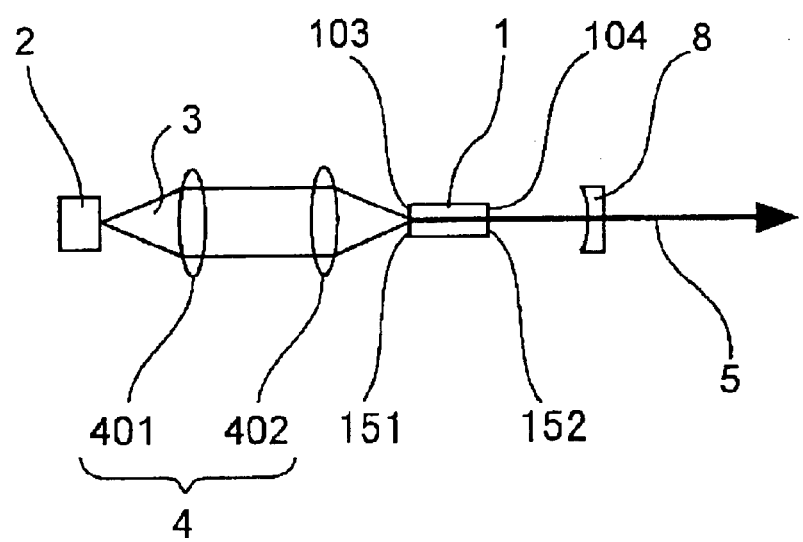
FIG. 26 is a schematic view showing a structure of the solid state laser device according to the prior art.

FIG. 25 is a side view showing a structure of an exciting portion of a solid state laser device according to an embodiment 21 of the present invention when viewed from the direction perpendicular to the optical axis of the solid state laser element. In the solid state laser device of the present embodiment, the alignment and the exciting structure of four solid state laser elements 1a, 1b, 1c, 1d are similar to those in the above embodiment 14, and four solid state laser elements 1a, 1b, 1c, 1d are arranged by stacking in the vertical direction. The semiconductor laser arrays as the excitation lasers are arranged at the back of the solid state laser elements 1a, 1b, 1c, 1d.

In the solid state laser device of the present embodiment, the optical axes of the solid state laser light 5 passing through respective solid state laser elements 1a, 1b, 1c, 1d are bent respectively by using three orthogonal prisms 15a, 15b, 15c, and thus four solid state laser elements 1a, 1b, 1c, 1d are optically coupled in series. Also, the second optical resonator to the solid state laser light is constructed by applying the high reflection coating to the wavelength of the solid state laser light to the end face 103 of the first solid state laser element 1a and applying the partial reflection coating to the wavelength of the solid state laser light to the end face 104 of the second solid state laser element 1b. Accordingly, the first solid state laser element 1a and the second solid state laser element 1b are used as the oscillator, and the third solid state laser element 1c and the fourth solid state laser element 1d are used as the amplifiers.

As shown in the solid state laser device of the present embodiment, if a plurality of solid state laser elements are arranged geometrically in parallel and are coupled optically in series, the higher output can be achieved effectively with the compact structure and no degradation of the beam quality (focusing ability).

In the solid state laser device of the present embodiment, there is shown the structure in which the optical axes of respective solid state laser elements are folded by using the orthogonal prisms. But the means for folding the optical axis is not limited to this. For example, it is needless to say that the similar advantages can be obtained by using the reflection optical system such as the orthogonal mirror, etc.

(Embodiment 22)

In the above-mentioned embodiments, the structure in which the semiconductor laser array is employed as the excitation laser and the low reflection coating to the oscillation wavelength of the semiconductor laser array is applied to the end face of the semiconductor laser array opposing to the solid state laser element is shown. In this case, in the structure shown in FIG. 7, for example, if the partial reflection coating to the oscillation wavelength of the semiconductor laser array 2 is applied to the end face 202 of the semiconductor laser array 2 opposing to the solid state laser element 1 and also a composite resonator is constructed by such end face 202 and the side 101 of the solid state laser element 1 to which the high reflection coating to the oscillation wavelength of the semiconductor laser array 2 is applied, the extremely high excitation light intensity can be obtained rather than the conventional solid state laser device in which the solid state laser element is arranged on the outside of the optical resonator, and thus the excitation of the solid state laser element can be carried out effectively.

In addition, if the first optical resonator is constructed by the composite resonator, the oscillation of the excitation laser can be maintained without fail in the situation that the change in the alignment angle and the position of the reflection mirrors arranged on the outside of the semiconductor laser array, and the like are caused. Therefore, there is such an advantage that the alignment precision of the solid state laser element and the external mirrors can be relaxed and the assembling/adjustment can be made simple.

In respective above embodiments, there is shown the structure in which the second optical resonators are provided to all solid state laser elements and used as the laser oscillators. In this case, it is needless to say that the solid state laser medium excited by the above structure can be utilized as the amplifier without the second optical resonator.

Also, in respective above embodiments, there is shown the structure in which mainly the Yb and Nd-doped YAG crystal is employed as the material of the solid state laser element and the semiconductor laser array that contains mainly InGaAs and AlGaAs as the principal component is employed as the excitation laser. In this case, the types of the solid state laser element and the semiconductor laser array are not limited to those. The optimum solid state laser element may be selected to meet the desired wavelength and the operation characteristic, and the semiconductor laser array that coincides with the absorption wavelength of the solid state laser element may be selected.

In addition, in respective above embodiments, there is shown the structure in which all solid state laser elements are positioned on the heat sink and are indirectly cooled. But the cooling method is not limited to this. If the direct water cooling is employed by the water-cooled jacket, the more effective cooling can be executed. Further, the gas may be sprayed directly to the water-soluble solid state laser element, or the like.

Moreover, in respective above embodiments, all structures in which one solid state laser element is arranged in the first optical resonator that consists of one or plural excitation lasers and is excited are shown. In this case, the number of the solid state laser elements arranged in the first optical resonator is not limited to this. A plurality of solid state laser elements may be arranged in the first optical resonator that consists of one or plural excitation lasers.

Besides, in respective above embodiments, all structures in which the semiconductor laser array is employed as the excitation laser are shown. In this case, the semiconductor laser array consisting of a single light-emitting portion may be employed. Also, in the structure in which any laser in addition to the semiconductor laser is used to optically excite the solid state laser element, it is possible to excite effectively the solid state laser element by arranging the solid state laser element in the first optical resonator. For example, in the structure in which the Ti (Titanium)-doped sapphire crystal is employed as the solid state laser element and also an argon laser that is one of gas laser is employed as the excitation laser, the excitation efficiency can be widely improved by arranging the solid state laser element in the optical resonator of the argon laser.

In summary, in the solid state laser device that optically excites by using the laser, if the solid state laser element is arranged in the first optical resonator constructed by the excitation laser irrespective of the solid state laser element, the excitation laser, material, type, number, and structure of the resonator, the efficiency can be improved effectively in contrast to the conventional solid state laser device in which the solid state laser element is arranged on the outside of the first optical resonator constructed by the excitation laser.

Advantages of the Invention

The solid state laser device according to the present invention, for exciting the solid state laser element by a laser light emitted from the excitation laser as the excitation light and then outputting the solid state laser light to the outside, wherein the solid state laser element is arranged in the first optical resonator through which the excitation light passes, and the solid state laser element is excited by the excitation light which is confined in the first optical resonator. Therefore, since it is possible to optically excite effectively by irradiating the solid state laser element at the extremely higher excitation light intensity than the prior art, the solid state laser device can be constructed compactly and also the solid state laser light can be generated effectively.

Also, in the solid state laser device according to the present invention, the excitation laser is formed of a semiconductor laser. Therefore, the solid state laser element can be excited effectively.

Also, in the solid state laser device according to the present invention, the first optical resonator is constructed by the mirror which consists of an end face of the semiconductor laser arranged on the opposite side to an excitation light outgoing side and has a high reflection coating to the excitation light, and the mirror which consists of the side of the solid state laser element arranged on an opposite side to the semiconductor laser and has the high reflection coating to the excitation light. Therefore, the excitation light can be confined strongly in the first optical resonator.

Also, in the solid state laser device according to the present invention, the first optical resonator is constructed by the mirror which consists of the end face of the semiconductor laser arranged on an opposite side to an excitation light outgoing side and has the high reflection coating to the excitation light, and the mirror which is arranged on a side direction of the solid state laser element on the opposite side to the semiconductor laser and has the high reflection coating to the excitation light. Therefore, since the precision of the alignment position/angle of the solid state laser element to the semiconductor laser array can be relaxed, assembling/adjustment can be carried out more simply. In addition, since the position/angle of the high reflection mirror can be easily adjusted, the solid state laser element can always be excited effectively by adjusting the high reflection mirror to maximize the excitation light intensity in the first optical resonator even when the deviation of position/angle of the solid state laser element is caused.

Also, the solid state laser device according to the present invention further comprises a second optical resonator for extracting the solid state laser light to an outside, wherein the second optical resonator is constructed by a mirror which consists of an end face of the solid state laser element arranged on a side from which the solid state laser light is emitted and has a partial reflection coating to the solid state laser light, and a mirror which consists of another end face of the solid state laser element and has a high reflection coating to the solid state laser light. Therefore, the solid state laser light can be extracted effectively from the solid state laser element.

Also, the solid state laser device according to the present invention further comprises a second optical resonator for extracting the solid state laser light to an outside, wherein the second optical resonator is constructed by the mirror which is arranged in a direction, along which the solid state laser light is emitted, and has a partial reflection coating to the solid state laser light, and the mirror which is arranged on a side opposite to the direction in an optical direction and has a high reflection coating to the solid state laser light. Therefore, since the resonator length of the solid state laser element and the mirrors used in the resonator can be changed simply, adjustment of the mode and the beam quality of the solid state laser light can be easily carried out. In addition, since the angles of the high reflection mirror and the partial reflection mirror constituting the second optical resonator can be adjusted, the solid state laser light can always be extracted effectively and stably from the solid state laser element by adjusting the alignment angles of the high reflection mirror and the partial reflection mirror to their optimal angles to maximize the optical output of the solid state laser light even when the optical axis of the solid state laser light is changed due to the heat generation in the solid state laser element, etc.

Also, in the solid state laser device according to the present invention, a low reflection coating to the excitation light is applied to the excitation light outgoing end face of the semiconductor laser. Therefore, the intensity of the excitation light in the first optical resonator can be maintained highly.

Also, in the solid state laser device according to the present invention, a low reflection coating to the excitation light is applied to a side of the solid state laser element opposing to the semiconductor laser. Therefore, the intensity of the excitation light in the first optical resonator can be maintained highly.

Also, in the solid state laser device according to the present invention, an optical axis of the solid state laser element has a predetermined angle to an optical axis of the excitation light that travels through the first optical resonator reciprocally. Therefore, the reflected light on the side of the solid state laser element can be prevented from returning to the inside of the semiconductor laser array, and the oscillation of the excitation laser can always be maintained stably, and thus the stable solid state laser light can be generated effectively. Also, since the reflected light on the side of the solid state laser element is never returned to the inside of the excitation laser, the stable oscillation of the excitation laser can be maintained and also the solid state laser light can be generated effectively and stably, in the inexpensive structure in which no coating is applied to the side of the solid state laser element.

Also, in the solid state laser device according to the present invention, an optical element for shaping a pattern of the excitation light is arranged in the first optical resonator. Therefore, since there is no necessity that the solid state laser element should be arranged in vicinity of the semiconductor laser array, the alignment precision of the solid state laser element to the semiconductor laser array can be relaxed, and thus the assembling/adjustment of the solid state laser device can be facilitated.

Also, in the solid state laser device according to the present invention, a wavelength-converting crystal is arranged in the second optical resonator. Therefore, the second harmonic can be generated extremely effectively with the compact structure.

Also, in the solid state laser device according to the present invention, the wavelength-converting crystal is arranged on an optical axis of the solid state laser element in an outgoing direction of the solid state laser light, a coating that exhibits a high reflection to the solid state laser light and exhibits a low reflection to a second harmonic of the solid state laser light is applied to an end face of the wavelength-converting crystal on an opposite side to the solid state laser element, a coating that exhibits a low reflection to the solid state laser light and exhibits a high reflection to a second harmonic of the solid state laser light is applied to an end face of the wavelength-converting crystal opposing to the solid state laser element, a low reflection coating to the solid state laser light is applied to an end face of the solid state laser element opposing to the wavelength-converting crystal, and a high reflection coating to the solid state laser light is applied to an end face of the solid state laser element on an opposite side to the wavelength-converting crystal. Therefore, the second harmonic can be generated extremely effectively with the compact structure.

Also, in the solid state laser device according to the present invention, a passive Q switching element is arranged in the second optical resonator. Therefore, the sharp pulse laser light that has a short pulse time width and a high peak intensity can be generated with the compact structure.

Also, in the solid state laser device according to the present invention, the passive Q switching element is arranged on an optical axis of the solid state laser element in an outgoing direction of the solid state laser light, a partial reflection coating to the solid state laser light is applied to an end face of the passive Q switching element on an opposite side to the solid state laser element, a low reflection coating to the solid state laser light is applied to an end face of the passive Q switching element opposing to the solid state laser element, a low reflection coating to the solid state laser light is applied to an end face of the solid state laser element opposing to the passive Q switching element, and a high reflection coating to the solid state laser light is applied to an end face of the solid state laser element on an opposite side to the passive Q switching element. Therefore, the sharp pulse laser light that has a short pulse time width and a high peak intensity can be generated with the compact structure.

Also, in the solid state laser device according to the present invention, both end faces of the solid state laser element in an optical axis direction of the solid state laser light have a Brewster angle to the solid state laser light. Therefore, since the solid state laser light propagates through the solid state laser element in the zig-zag optical path, the optical influence of the refractive index distribution upon the solid state laser light can be canceled mutually. Thus, even if the refractive index distribution is caused by the heat generation of the solid state laser element, the stable and effective laser oscillation can be obtained while maintaining the high beam quality.

Also, in the solid state laser device according to the present invention, a three-level laser medium is employed as the solid state laser element. Therefore, in the solid state laser element having the three-level laser oscillating mechanism which is difficult to generate the laser oscillation effectively in the solid state laser device in the prior art, the solid state laser light can be generated effectively.

Also, in the solid state laser device according to the present invention, the excitation laser consists of at least two lasers, and the solid state laser element is optically excited by the excitation laser in at least two directions. Therefore, the higher output of the solid state laser light can be achieved effectively, and the influence of the excitation density gradient in the solid state laser element upon the optical axis direction of the excitation laser can be compensated, so that the solid state laser light that is excellent in the beam quality can be generated stably.

Also, in the solid state laser device according to the present invention, the solid state laser element has optical paths of the solid state laser light, that are combined together via orthogonal prisms. Therefore, the higher output can be attained effectively with the compact structure not to damage the converging performance of the solid state laser light.

Also, the solid state laser device system according to the present invention, constructed by a plurality of solid state laser devices each of which is set forth in any one of claim 1 to claim 16 and which are stacked such that respective solid state laser lights are emitted in a same direction. Therefore, the highly-effective and high-output solid state laser can be accomplished.

What is claimed is:

1. A solid state laser device comprising:
   an excitation light source producing excitation light at a first wavelength;
   a first optical resonator in which light at the first wavelength resonate so that the excitation light at the first wavelength is confined by said first optical resonator and oscillates within said first optical resonator to produce coherent light at the first wavelength, wherein said excitation light source is located in said first optical resonator; and
   a solid state laser element having a part disposed within said first optical resonator, wherein said solid state laser element is excited by the excitation light at the first wavelength, confined and oscillating within said first optical resonator so that said solid state laser element spontaneously emits light at a second wavelength, different from the first wavelength, in response to the excitation light that is incident on said solid state laser element within said first optical resonator.

2. The solid state laser device according to claim 1, wherein said excitation light source and said first optical resonator constitute a semiconductor laser having an active layer emitting light, said first optical resonator including a mirror spaced from said active layer.

3. The solid state laser device according to claim 1, wherein said excitation light source includes a front face facing said solid state laser element and a rear face opposite the front faces and said first optical resonator comprises:
   a first mirror including, on the rear face of said excitation light source, a coating that is highly reflective to the excitation light, and
   a second mirror on a side of said solid state laser element that is opposite said excitation light source, with said solid state laser element located between the side and said excitation light source, said second mirror including a coating that is highly reflective to the excitation light.

4. The solid state laser device according to claim 1, wherein said excitation light source includes a front face facing said solid state laser element and a rear face opposite the front face, and said first optical resonator comprises:
   a first mirror including, on the rear face of said excitation light source, a coating that is highly reflective to the excitation light, and
   a second mirror on an opposite side of said said solid state laser element from said excitation light source and including a coating that is highly reflective to the excitation light.

5. The solid state laser device according to claim 1, further comprising a second optical resonator for confining and producing oscillation of the light at the second wavelength generated in said solid state laser element and for extracting the light at the second wavelength, wherein said second optical resonator includes
   a first mirror, including a first end face of said solid state laser element, through which the light at the second wavelength is emitted, and including a coating on the first end face that partially reflects the light at the second wavelength, and
   a second mirror, including a second end face of said solid state laser element, opposite the first end face, and including a coating on the second end face and that is highly reflective to the light at the second wavelength.

6. The solid state laser device according to claim 1, further comprising a second optical resonator for confining and producing oscillation of the light at the second wavelength generated in said solid state laser element and for extracting the light at the second wavelength, wherein said second optical resonator includes
   a first mirror positioned on a first side of said solid state laser element relative to a direction along which the light at the second wavelength is emitted, along the direction in which the light at the second wavelength is emitted, and including a coating that partially reflects the light at the second wavelength, and
   a second mirror positioned on a opposite side of said solid state laser element from said first mirror, along the direction in which the light at the second wavelength is emitted, and including a coating that is highly reflective to the light at the second wave.

7. The solid state laser device according to claim 1, wherein said excitation light source includes a front face facing said solid state laser element and a rear face, opposite the front face, and including a coating weakly reflecting the excitation light and disposed on the front face of said excitation light source.

8. The solid state laser device according to claim 1, including a coating weakly reflecting the excitation light and disposed on a side of said solid state laser element facing said excitation light source.

9. The solid state laser device according to claim 1, wherein an optical axis of said state laser element has an angle, relative to an optical axis of the excitation light that oscillates in said first optical resonator, ranging from zero to 180°.

10. The solid state laser device according to claim 1, including an optical element for shaping a pattern of the excitation light and located within said first optical resonator.

11. The solid state laser device according to claim 6, including a wavelength-converting crystal located within said second optical resonator.

12. The solid state laser device according to claim 11, wherein said wavelength-converting crystal is located on an optical axis of said solid state laser element in an outgoing direction of the light at the second wavelength, and including
- a first coating highly reflective to the light at the second wavelength and weakly reflecting a second harmonic of the light at the second wavelength, disposed on a first face of said wavelength-converting crystal opposite a second face of said wavelength-converting crystal, the second face of said wavelength-converting crystal facing said solid state laser element,
- a second coating weakly reflecting the light at the second wavelength and highly reflective to a second harmonic of the light at the second wavelength, disposed on the second face of said wavelength-converting crystal,
- a third coating weakly reflecting the light at the second wavelength, disposed on a first face of said solid state laser element facing said wavelength-converting crystal, and
- a fourth coating highly reflective of the light at the second wavelength, disposed on a second face of said solid state laser element opposite the first face of said wavelength-converting crystal said solid state laser element.

13. The solid state laser device according to claim 6, including a passive Q switching element located within said second optical resonator.

14. The solid state laser device according to claim 13, wherein said passive Q switching element is located on an optical axis of said solid state laser element in an outgoing direction of the light at the second wavelength, and including
- a first coating partially reflecting the light at the second wavelength, disposed on a first face of said passive Q switching element opposite a second face of said passive Q switching element, the second face of said passive Q switching element facing said solid state laser element,
- a second coating weakly reflecting the light at the second wavelength, disposed on the second face of said passive Q switching element,
- a third coating weakly reflecting the light at the second wavelength, disposed on a first face of said solid state laser element facing said passive Q switching element, and
- a fourth coating highly reflective of the light at the second wavelength, disposed on a second face of said solid state laser element, opposite the first face of said solid state laser element.

15. The solid state laser device according to claim 1, wherein said solid state laser element has end faces that, in an optical axis direction of light produced by said solid state laser element, are oriented at a Brewster angle to the light at the second wavelength produced by said solid state laser element.

16. The solid state laser device according to claim 1, including at least two of said excitation light sources respectively producing excitation light, wherein said solid state laser element is optically excited by the excitation light produced by said excitation light sources in respective, different directions.

17. The solid state laser device according to claim 1, including combining paths of the light at the second wavelength.

18. A solid state laser device system comprising a plurality of solid state laser devices according to claim 1, wherein said solid state laser devices are stacked to emit respective beams of the light at the first wavelength in a common direction.

* * * * *